(12) United States Patent
Kim et al.

(10) Patent No.: US 12,033,855 B2
(45) Date of Patent: *Jul. 9, 2024

(54) METHODS OF MANUFACTURING SEMICONDUCTOR DEVICES FROM MULTI-DEVICE SEMICONDUCTOR WAFERS

(71) Applicant: Samsung Electronics Co., Ltd., Suwon-si (KR)

(72) Inventors: Jang Hoon Kim, Seoul (KR); Soo Kyung Kim, Seongnam-si (KR); Tae-Kyu Kim, Hwaseong-si (KR); Young Kuk Byun, Suwon-si (KR); Woo Jin Jung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 666 days.

This patent is subject to a terminal disclaimer.

(21) Appl. No.: 17/322,412

(22) Filed: May 17, 2021

(65) Prior Publication Data

US 2022/0093393 A1 Mar. 24, 2022

(30) Foreign Application Priority Data

Sep. 23, 2020 (KR) .......................... 10-2020-0122956

(51) Int. Cl.
*H01L 21/027* (2006.01)
*H01L 21/311* (2006.01)

(52) U.S. Cl.
CPC .... *H01L 21/0274* (2013.01); *H01L 21/31144* (2013.01)

(58) Field of Classification Search
CPC ........... H01L 21/0274; H01L 21/31144; H01L 21/0332; H01L 21/0337; H01L 21/76802;
(Continued)

(56) References Cited

U.S. PATENT DOCUMENTS

| 6,268,090 B1 * | 7/2001 | Matsubara | ........ H01L 21/76843 |
| | | | 257/E21.585 |
| 9,659,940 B2 * | 5/2017 | Park | ........................ H01L 28/90 |

(Continued)

FOREIGN PATENT DOCUMENTS

| KR | 19960002587 A | 1/1996 |
| KR | 20010064054 A | 7/2001 |

(Continued)

*Primary Examiner* — Caleen O Sullivan
(74) *Attorney, Agent, or Firm* — Myers Bigel, P.A.

(57) ABSTRACT

A method of manufacturing a semiconductor device includes forming a mold layer on a semiconductor wafer having a plurality of integrated circuit die at least partially defined therein. An etch stopper film is selectively formed on a second portion of the mold layer extending adjacent a periphery of the semiconductor wafer, but not on a first portion of the mold layer extending opposite at least one of the plurality of integrated circuit die. A preliminary pattern layer is formed on the etch stopper film and on the first portion of the mold layer. A plurality of patterns are formed in the preliminary pattern layer by selectively exposing the preliminary pattern layer to extreme ultraviolet light (EUV). Then, hole patterns are selectively formed in the first portion of the mold layer, using the exposed preliminary pattern layer and the etch stopper film as an etching mask.

20 Claims, 19 Drawing Sheets

(58) Field of Classification Search
CPC .... H10B 12/033; H10B 12/315; H10B 12/02; G03F 7/2004
USPC .......................................................... 438/703
See application file for complete search history.

(56) References Cited

U.S. PATENT DOCUMENTS

| | | | |
|---|---|---|---|
| 9,935,111 B2 * | 4/2018 | Kim | ........................ H10B 12/34 |
| 11,600,495 B2 * | 3/2023 | Choi | .................... H01L 21/0337 |
| 2001/0033975 A1 | 10/2001 | Chung et al. | |
| 2009/0004864 A1 * | 1/2009 | Kim | .................... H01L 21/3212 |
| | | | 438/693 |
| 2016/0293728 A1 * | 10/2016 | Seo | ........................ G03F 7/2002 |

FOREIGN PATENT DOCUMENTS

| | | | |
|---|---|---|---|
| KR | 20030034308 A | 5/2003 | |
| KR | 20080010878 A | 1/2008 | |
| KR | 20090044523 A | 5/2009 | |
| KR | 101052929 B1 | 7/2011 | |
| KR | 101057192 B1 | 8/2011 | |
| KR | 20160116663 A | 10/2016 | |

\* cited by examiner

FIG. 4
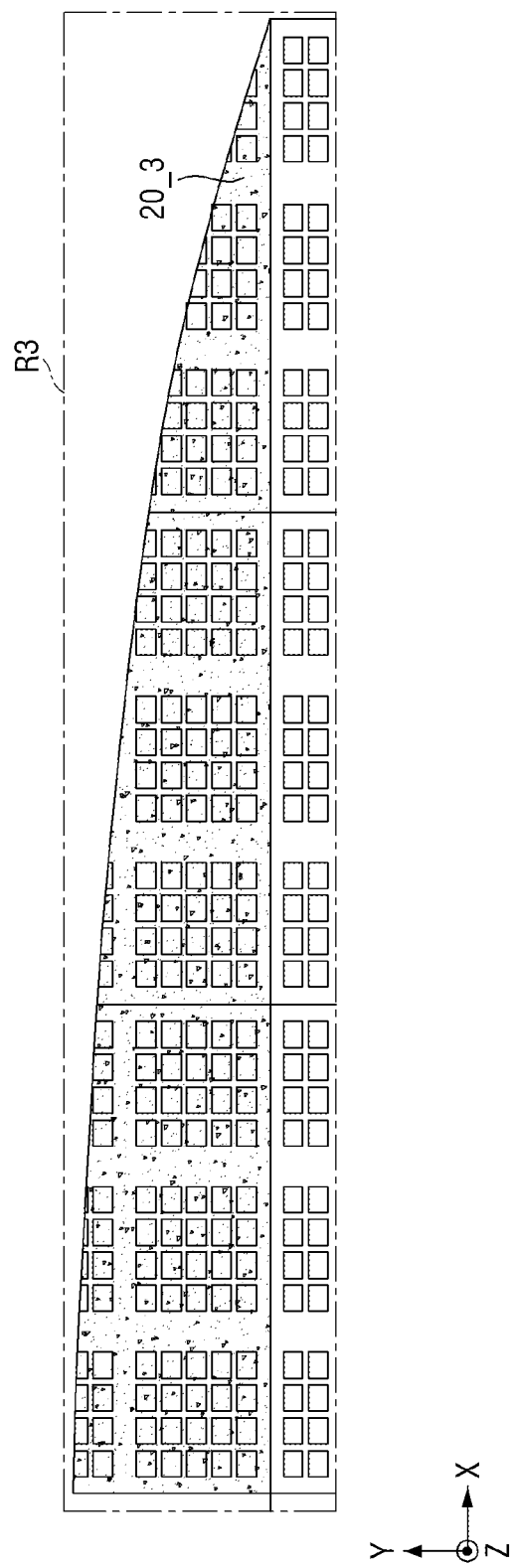
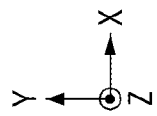

METHODS OF MANUFACTURING SEMICONDUCTOR DEVICES FROM MULTI-DEVICE SEMICONDUCTOR WAFERS

REFERENCE TO PRIORITY APPLICATION

This application claims priority to Korean Patent Application No. 10-2020-0122956, filed Sep. 23, 2020, the disclosure of which is hereby incorporated herein by reference.

BACKGROUND

1. Field

The present disclosure relates to semiconductor device manufacturing methods and, more particularly, to methods that utilize selective ultraviolet patterning of photosensitive layers on semiconductor wafers.

2. Description of the Related Art

With developments in the electronic industry, demands for high functionality, high speed, and miniaturization of electronic components have increased, and the manufacturing process of semiconductor devices has developed in the direction of increasing degrees of integration. Accordingly, highly-scaled patterns on highly integrated semiconductor devices can have fine linewidths, which can be spaced apart at fine pitch.

Patterning beyond the range of use of double patterning (DPT) has been needed, and as part of the effort to meet this need, extreme ultraviolet (EUV) patterning has been introduced. However, to implement fine patterns via EUV patterning, photoresist, which is to be exposed to form the fine patterns, needs to be thinned down. However, if a photoresist layer has regions with a non-uniform thickness (or a relatively large thickness), the fine patterns formed by EUV patterning may become uneven, resulting in deterioration of a semiconductor device.

SUMMARY

Embodiments of the present disclosure provide a method of manufacturing a semiconductor device, which can increase the integration density of a semiconductor device through the arrangement of an etch stopper film, and can simplify the fabrication of a semiconductor device.

Embodiments of the present disclosure also provide a method of manufacturing a semiconductor device, which can increase the integration density of a semiconductor device, and can improve the reliability of an apparatus including a semiconductor device.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to an embodiment of the present disclosure, there is provided a method of manufacturing a semiconductor device, which includes providing a substrate having, defined thereon, a die forming area and an edge die area. This edge die includes a first cell area and a second cell area disposed between the first cell area and the die forming area. A sequence of process steps are then performed, which include forming a mold layer, a supporter layer, and a mask layer on the substrate, and forming an etch stopper film to cover a top surface of the first cell area (but not the second cell area). A preliminary pattern layer is formed on the etch stopper film and on the mask layer. Then, first patterns, second patterns, and third patterns are formed on the first cell area, the second cell area, and the die forming area, respectively, by: (i) exposing the preliminary pattern layer to extreme ultraviolet (EUV) light, and (ii) forming hole patterns in the mold layer and the supporter layer (in the die forming area and the second cell area) by etching the mask layer using the etch stopper film, the second patterns, and the third patterns.

According to the aforementioned and other embodiments of the present disclosure, there is provided a method of manufacturing a semiconductor device, which includes providing a substrate having, defined thereon, a die forming area and an edge die area. This edge die area includes a first cell area and a second cell area disposed between the first cell area and the die forming area. A mold layer, a supporter layer, and a mask layer are formed, in sequence, on the substrate. An etch stopper film is formed to cover a top surface of the first cell area, but not cover a top surface of the second cell area. A preliminary pattern layer is formed on the etch stopper film and on the mask layer. First patterns, second patterns, and third patterns are formed on the first cell area, the second cell area, and the die forming area, respectively, by exposing the preliminary pattern layer to light. In some of these embodiments, a top surface of the mask layer is disposed at the same height from the substrate, between the die forming area and the edge die area, and bottom surfaces of the first patterns, the second patterns, and the third patterns are sequentially higher than the substrate. At least some of the second patterns in the second cell area may have a wedge shape (e.g., in cross-section) that tapers down to a point toward the bottom thereof.

According to the aforementioned and other embodiments of the present disclosure, there is provided a method of manufacturing a semiconductor device. This method includes providing a substrate having therein: a die forming area, a first edge die area, which includes a first cell area, and an second edge die area, which includes a second cell area. A mold layer, a supporter layer, and a mask layer are sequentially formed on the substrate. An etch stopper film is formed to cover top surfaces of the first and second cell areas, but is not formed on a dummy cell area (between the first cell area and the die forming area and between the second cell area and the die forming area). A preliminary pattern layer is formed on the etch stopper film and on the mask layer. First patterns, second patterns, and third patterns are formed on the first and second cell areas, on the dummy cell area, and on the die forming area, respectively. These first through third patterns are formed by exposing the preliminary pattern layer to light. Based on these steps, at least some of the second patterns in the dummy cell area have a wedge shape (e.g., in cross-section) that tapers down to a point toward the bottom thereof. Moreover, a first width of the dummy cell area (between the first cell area and the die forming area) may be different from a second width of the dummy cell area (between the second cell area and the die forming area).

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which:

FIG. 4 is an enlarged plan view of a region R3 of FIG. 2 and illustrates the layout of the die forming area and the edge die area in the region R3;

DETAILED DESCRIPTION

Figure 1:
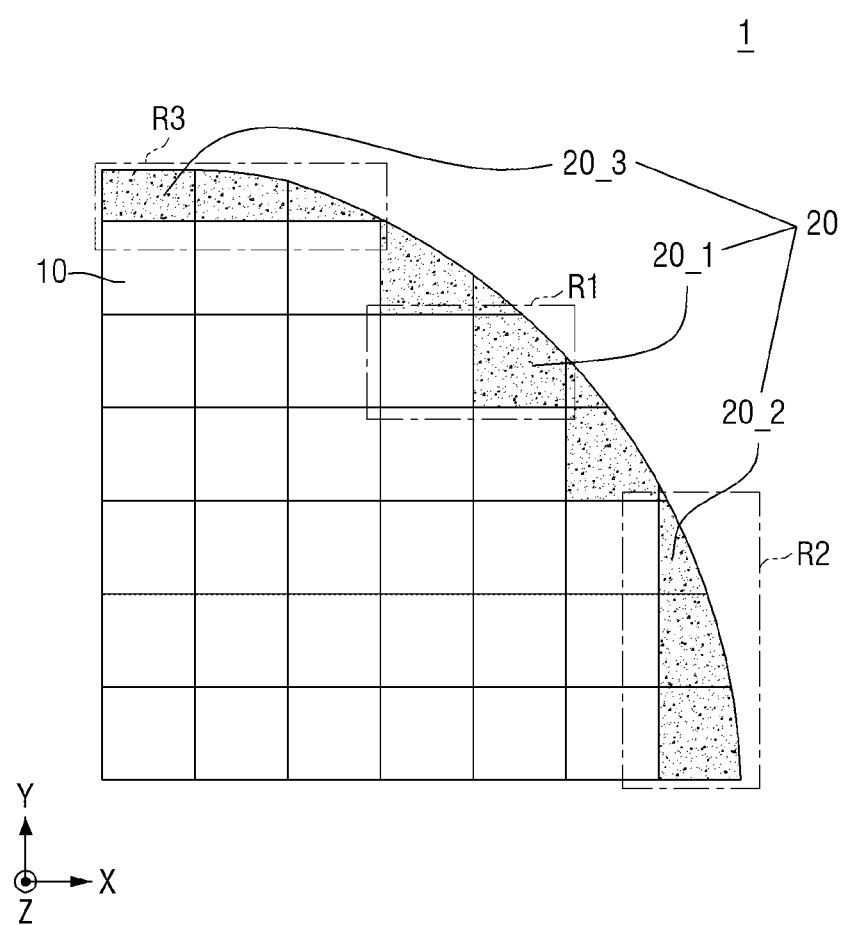
FIG. 1 is a plan view of part of a wafer according to some embodiments of the present disclosure.

Embodiments of the present disclosure will hereinafter be described with reference to the accompanying drawings. In FIGS. 1 through 19, like reference numerals indicate like elements, and thus, repeated detailed descriptions thereof will be omitted. Similar elements will hereinafter be referred to by similar reference numerals throughout the present disclosure.

Figure 2:
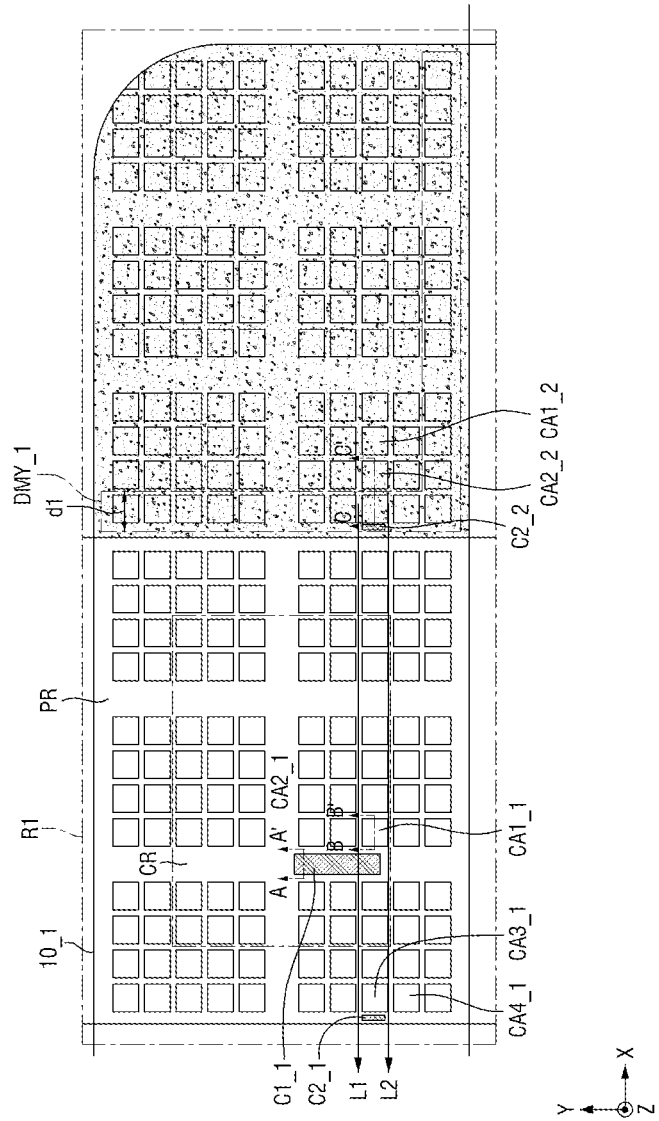
FIG. 2 is an enlarged plan view of a region R1 of FIG. 1 and illustrates the layout of a die forming area and an edge die area in the region R1.
Figure 3:
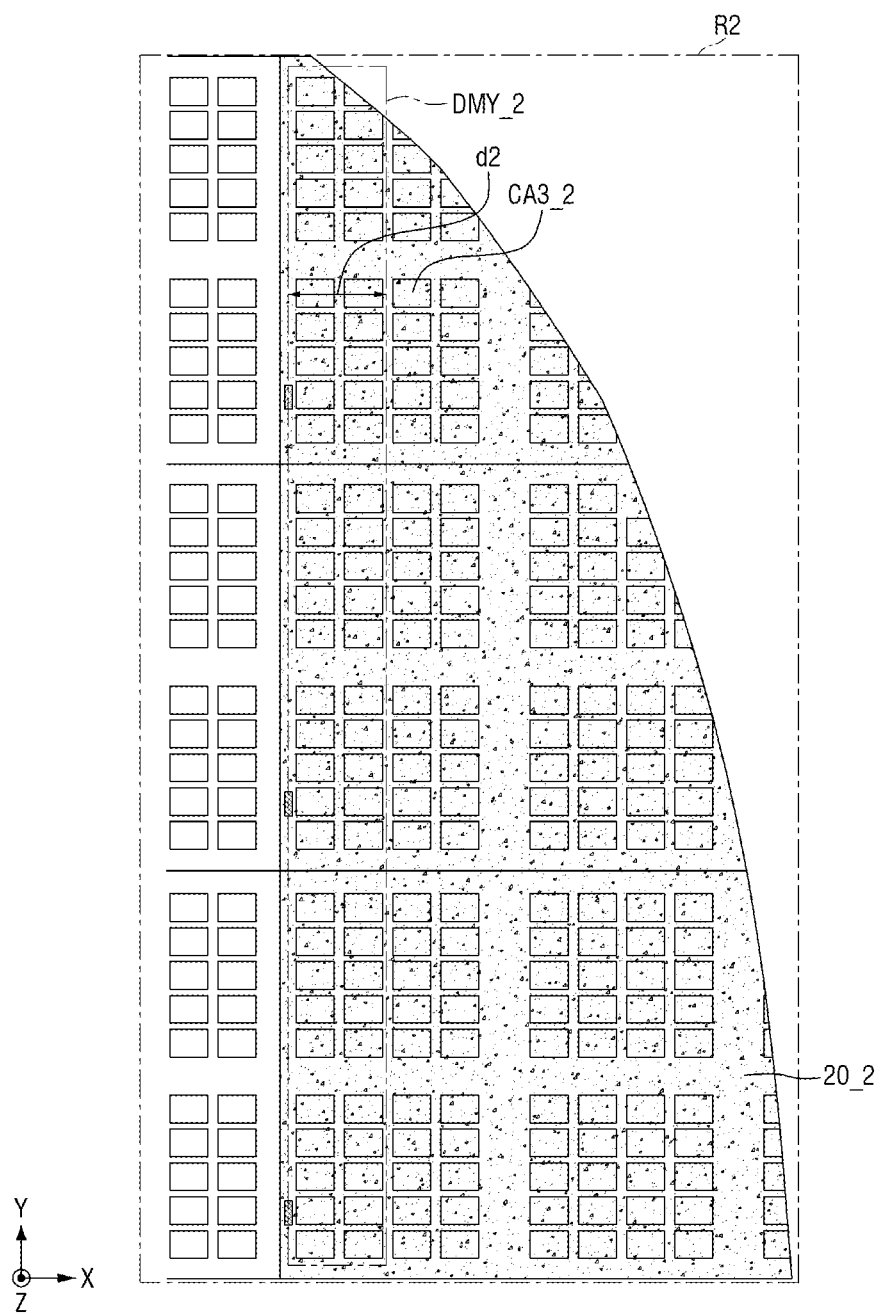
FIG. 3 is an enlarged plan view of a region R2 of FIG. 2 and illustrates the layout of the die forming area and the edge die area in the region R2.

FIG. 1 is a plan view of part of a wafer according to some embodiments of the present disclosure. FIG. 2 is an enlarged plan view of a region R1 of FIG. 1 and illustrates the layout of a die forming area and an edge die area in the region R1. FIG. 3 is an enlarged plan view of a region R2 of FIG. 1 and illustrates the layout of the die forming area and the edge die area in the region R2. FIG. 4 is an enlarged plan view of a region R3 of FIG. 1 and illustrates the layout of the die forming area and the edge die area in the region R3.

Referring to FIGS. 1 through 4, a wafer 1 may include a die forming area 10, in which a chip 10_1 is formed, and an edge die area 20, which is located along the edges of the wafer 1 and surrounds the die forming area 10. The chip 10_1 of the die forming area 10 may be a volatile memory chip such as a dynamic random access memory (DRAM) chip, or a static random access memory (SRAM) chip, a nonvolatile memory chip such as a phase-change random access memory (PRAM) chip, a magnetoresistive random access memory (MRAM) chip, a ferroelectric random access memory (FeRAM) chip, a resistive random access memory (RRAM) chip, or a flash memory, or a logic chip such as a central processing unit (CPU), a microprocessor unit (MPU), a graphic processor unit (GPU), a controller, or an application specific integrated circuit (ASIC), a modem chip, or an application processor (AP). For convenience, the chip 10_1 will hereinafter be described as being, for example, a DRAM chip.

The chip 10_1 of the die forming area 10 may include first and second memory cell blocks CA1_1 and CA2_1, which are disposed in a central region CR, third and fourth memory cell blocks CA3_1 and CA4_1, which are disposed in a peripheral region PR, and a plurality of first chip capacitors C1_1 and a plurality of second chip capacitors C2_1, which are for driving the chip 10_1. The first through fourth memory cell blocks CA1_1 through CA4_1 may have the same structure. The structure of the first through fourth memory cell blocks CA1_1 through CA4_1 will be described later, taking the first memory cell block CA1_1.

The peripheral region PR of the chip 10_1 may correspond to dummy cell areas (DMY_1 and DMY_2) of the edge die area 20. Thus, when the chip 10_1 is laid over the edge die region 20, the central region CR of the chip 10_1 does not overlap with the dummy cell areas (DMY_1 and DYM_2).

The first chip capacitors C1_1 may be disposed in the central region CR, and the second chip capacitors C2_1 may be disposed in the peripheral region PR. The first chip capacitors C1_1 intersect a first line L1 that extends between the first and second memory cell blocks CA1_1 and CA2_1, and the second chip capacitors C2_1 do not intersect a second line L2 that extends between the third and fourth memory cell blocks CA3_1 and CA4_1.

The first chip capacitors C1_1 and the second chip capacitors C2_1 differ from in their quantity, and have the same structure, except for the structure of a lower structure 100 (of FIG. 6) therein. The first chip capacitors C1_1 and the second chip capacitors C2_1 may form single blocks via their respective supporter layers. Accordingly, the supporter layer that forms the first chip capacitors C1_1 may intersect the first line L1.

A first edge die area 20_1 of the edge die area 20 may be disposed adjacent to the chip 10_1 of the die forming area 10. The first edge die area 20_1 may form a first dummy cell area DMY_1, which is L-shaped, near the chip 10_1 of the die forming area 10. The first edge die area 20_1 may include first cell areas CA1_2, which are not disposed in the first dummy cell area DMY_1, and second cell areas CA2_2 and edge capacitors C2_2, which are disposed in the first dummy cell area DMY_1. The first cell areas CA1_2 and the second cell areas CA2_2 will be described later. The edge capacitors C2_2 correspond to the second chip capacitors C2_1 of the chip 10_1 and do not intersect the second line L2 that extends between the third and fourth memory cell blocks CA3_1 and CA4_1.

Referring to FIGS. 2 through 4, the edge die area 20 may include first through third edge die areas 20_1 through 20_3. The edge die area 20 may extend adjacent a periphery of the wafer 1.

The first through third edge die areas 20_1 through 20_3 may be arranged differently on the wafer 1. The first edge die area 20_1 may be an area that intersects part of the wafer 1 that extends from the center of the wafer 1 in a direction between first and second directions x and y, the second edge die area 20_2 may be an area that intersects part of the wafer 1 that extends from the center of the wafer 1 in the first direction x, and the third edge die area 20_3 may be an area that intersects part of the wafer 1 that extends from the center of the wafer 1 in the second direction y. The second edge die area 20_2 includes a second dummy cell area DMY_2, which is I-shaped, and the third edge die area 20_3, unlike the first and second edge die areas 20_1 and 20_2, do not form a dummy cell area.

A distance d1 between the die forming area 10 and the first cell areas CA1_2, which are not disposed in the first dummy cell area DMY_1 of the first edge die area 20_1, may differ from a distance d2 between the die forming area 10 and third cell areas CA3_2, which are not disposed in the second dummy cell area DMY_2 of the second edge die area 20_2. That is, the edge die area 20 may or may not include a dummy cell area depending on the location in the wafer 1.

The shapes, layouts, and patterns of arrangement of cell areas (CA1_2 and CA2_2), memory cell blocks (CA1_1 through CA4_1), capacitors (C1_1, C2_1, and C2_2), the dummy cell areas (DMY_1 and DMY_2), and the central and peripheral regions CR and PR of FIGS. 1 through 4 are not particularly limited and may vary without departing from the concept of the present disclosure.

Figure 5:
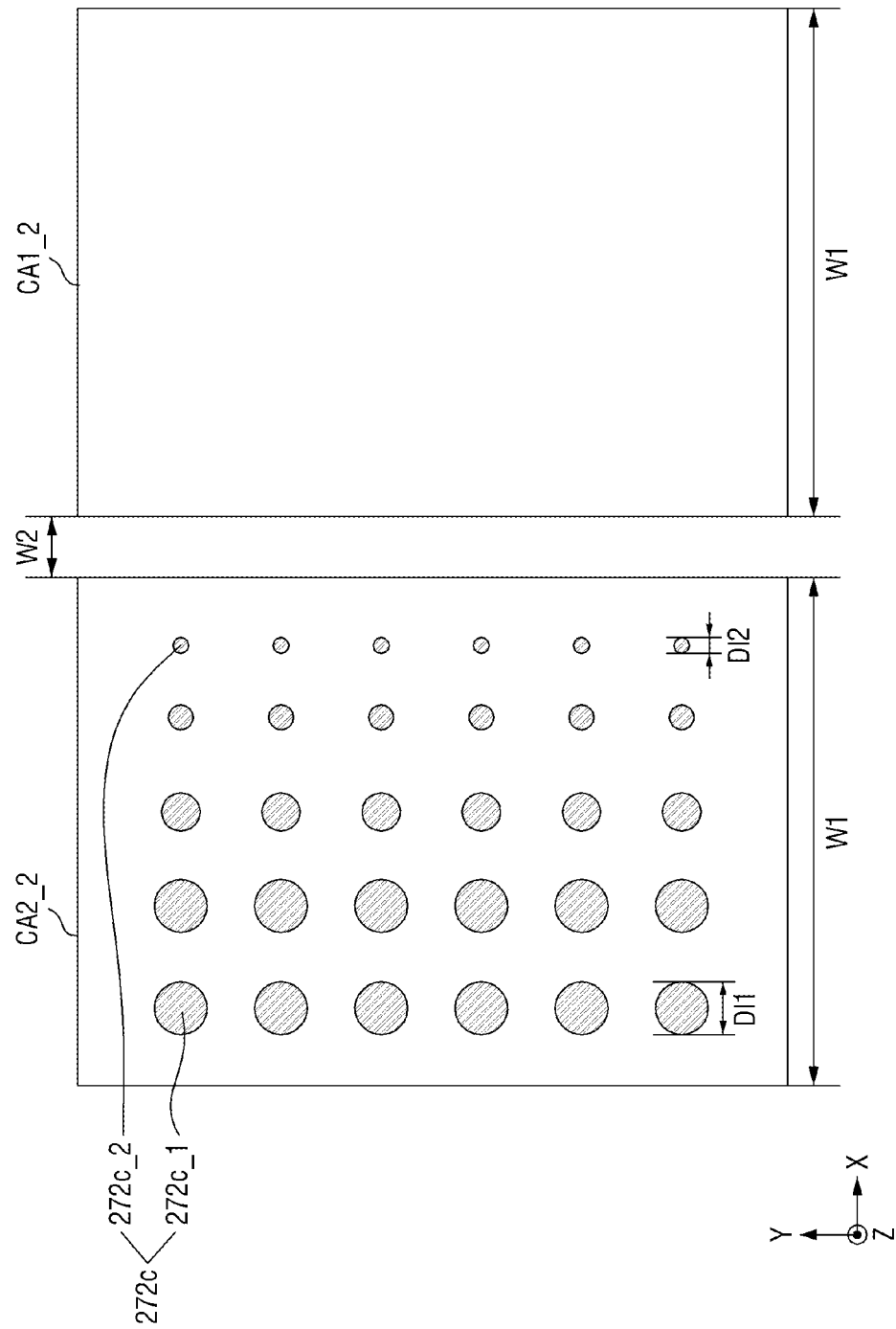
FIG. 5 illustrates lower electrodes of cell areas included in the edge die area.
Figure 6:
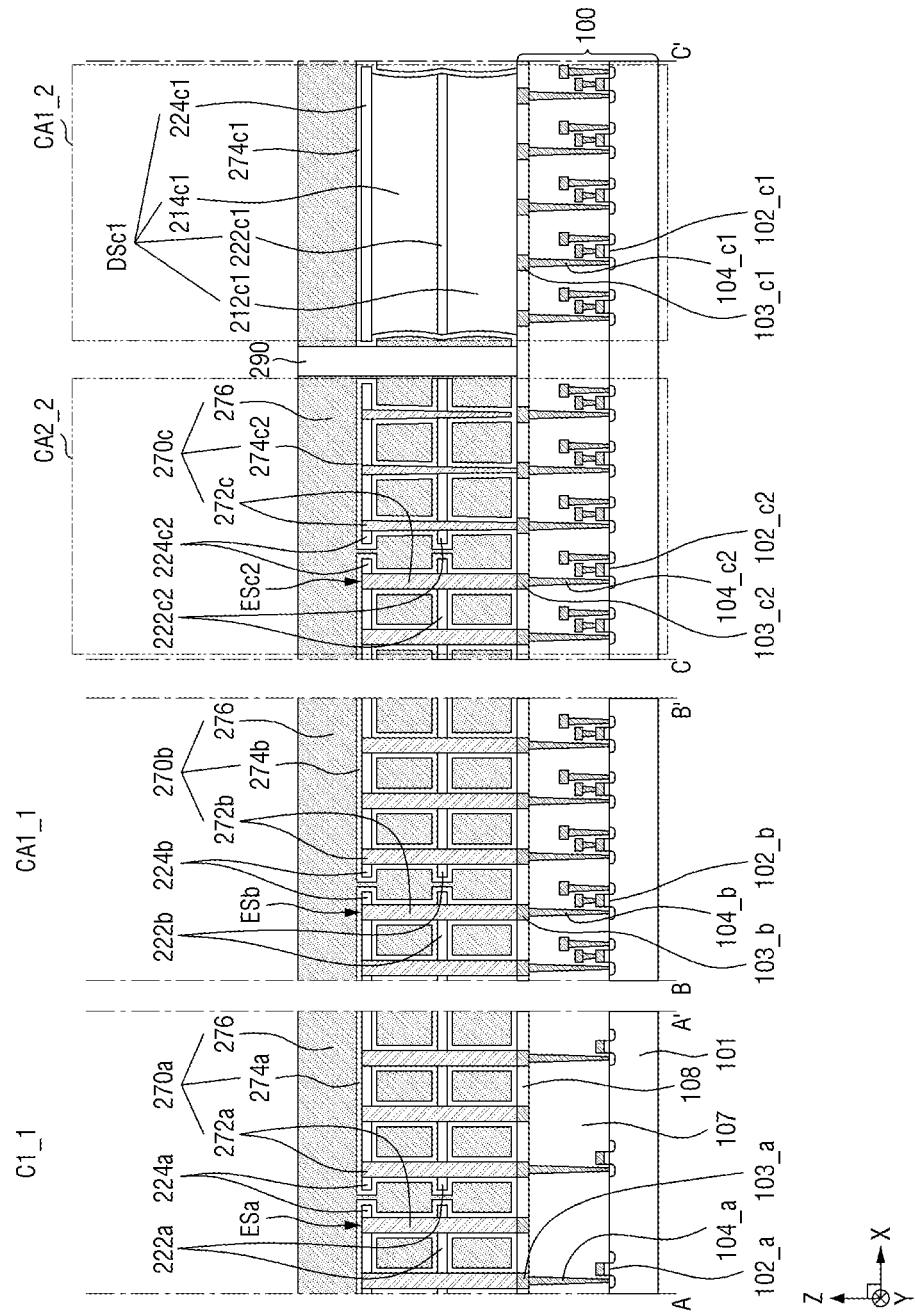
FIG. 6 is a cross-sectional view taken along lines A-A', B-B', and C-C' of FIG. 2.

FIG. 5 illustrates lower electrodes of cell areas included in the edge die area 20. FIG. 6 is a cross-sectional view taken along lines A-A', B-B', and C-C' of FIG. 2. FIG. 5 illustrates the arrangement of lower electrodes 272c in first and second cell areas CA1_2 and CA2_2.

Referring to FIGS. 1, 5, and 6, a semiconductor device in the wafer 1 may include a lower structure 100, which is formed below the first chip capacitors C1_1, the first memory cell blocks CA1_1, the first cell areas CA1_2, and the second cell area CA2_2. The second cell area CA2_2 corresponds to the dummy cell areas (DMY_1 and DMY_2) in the edge die area 20. Thus, The second cell area CA2_2 is formed between the die forming area 10 and the first cell areas CA1_2.

In particular, the lower structure 100 may include, at a location below the first chip capacitors C1_1, a substrate 101, driving transistors 102_1, which are on the substrate 101 and are for driving the first memory cell blocks CA1_1, driving plugs 103_1 and driving contacts 104_a, which electrically connect the driving transistors 102_a and driving capacitors 270a, a lower interlayer insulating film 107, which covers the substrate 101 and the driving transistors 102_a, and an insulating layer 108, which surrounds the driving plugs 103_a. The lower structure 100 may also include, at a location below the first memory cell blocks CA1_1, the substrate 101, memory transistors 102_b, which are on the substrate 101, memory plugs 103_b and memory contacts 104_b, which electrically connect the memory transistors 102_b and the memory capacitors 270b, the lower interlayer insulating film 107, which covers the substrate 101 and the memory transistors 102_b, and the insulating layer 108, which surrounds the memory plugs 103_b. The lower structure 100 may also include, at a location below the first cell areas CA1_2, the substrate 101, first dummy transistors 102_c1, which are on the substrate 101, first dummy plugs 103_c1 and first dummy contacts 104_c1, which are connected to the first dummy transistors 102_c1, the lower interlayer insulating film 107, which covers the substrate 101 and the first dummy transistors 102_c1, and the insulating layer 108, which surrounds the first dummy plugs 103_c1. Finally, the lower structure 100 may also include, at a location below the second cell areas CA2_2, the substrate 101, second dummy transistors 102_c2, which are on the substrate 101, second dummy plugs 103_c2 and second dummy contacts 104_c2, which electrically connect the second dummy transistors 102_c2 and dummy capacitors 270c, the lower interlayer insulating film 107, which covers the substrate 101 and the second dummy transistors 102_c2, and the insulating layer 108, which surrounds the second dummy plugs 103_c2.

The substrate 101 may include silicon (Si) such as crystalline Si, polycrystalline Si, or amorphous Si. Alternatively, the substrate 101 may include a semiconductor such as germanium (Ge) or a compound semiconductor such as silicon germanium (SiGe), silicon carbide (SiC), gallium arsenide (GaAs), indium arsenide (InAs), or indium phosphide (InP). Contacts (104_a, 104_b, 104_c1, and 104_c2) may connect source/drain regions, which are formed in the substrate 101, and capacitors (270a, 270b, and 270c). The contacts (104_a, 104_b, 104_c1, and 104_c2) may be formed of, for example, tungsten (W) or polysilicon.

In the first chip capacitors C1_1, capacitor region lower electrode structures ESa, which are formed by capacitor region lower electrodes 272a and capacitor region supporters (222a and 224a), and capacitor region dielectric films 274a and upper electrodes 276, which cover the capacitor region lower electrode structures ESa, may be formed on the lower structure 100. The capacitor region lower electrodes 272a, the capacitor region dielectric films 274a, and the upper electrodes 276 may form the driving capacitors 270a, and the driving capacitors 270a may form single block structures with the capacitor region supporters (222a and 224a).

The capacitor region lower electrodes 262 may be connected to the driving contacts 104_a, which are formed in the lower structure 100. The capacitor region lower electrodes 262 are illustrated as having a cylindrical shape, but the present disclosure is not limited thereto. Alternatively, the capacitor region lower electrodes 262 may have a pillar shape, but the present disclosure is not limited thereto.

The capacitor region dielectric films 274a may be formed to cover the capacitor region lower electrodes 272a and the capacitor region supporters (222a and 224a). The capacitor region dielectric films 274a may include silicon oxide or a high-k dielectric material. The capacitor region dielectric films 274a may include, for example, a double composite layer of a silicon oxide layer and a silicon nitride layer or a silicon oxide layer with the surface thereof nitrified. The high-k dielectric material may include, for example, at least one of aluminum oxide ($AlO_x$), tantalum oxide ($Ta_xO_y$), titanium oxide ($TiO_x$), yttrium oxide ($Y_xO_y$), zirconium oxide ($ZrO_x$), zirconium silicon oxide ($ZrSi_xO_y$), hafnium oxide ($HfO_x$), hafnium silicon oxide ($HfSi_xO_y$), lanthanum oxide ($La_xO_y$), lanthanum aluminum oxide ($LaAl_xO_y$), lanthanum hafnium oxide ($LaHf_xO_y$), hafnium aluminum oxide ($HfAl_xO_y$), praseodymium oxide ($Pr_xO_y$), and a combination thereof.

The upper electrodes 276 may be formed to cover the capacitor region lower electrode structures ESa, which are formed by the capacitor region lower electrodes 272a and the capacitor region supporters (222a and 224a), and the capacitor region dielectric films 274a. The upper electrodes 276 may include, for example, titanium, titanium nitride, tantalum nitride, platinum, tungsten, doped polysilicon, or doped silicon germanium. In some embodiments, the upper electrodes 276 may be formed of the same material as the lower electrodes 272, but the present disclosure is not limited thereto. In addition, the supporters (222a and 224a) may support the lower electrodes 272a, which are formed on the lower structure 100, not to collapse. In some embodiments, the supporters (222a and 224a) may include, for example, silicon nitride, tantalum oxide, or titanium oxide.

In the first memory cell blocks CA1_1, memory lower electrode structures ESb, which are formed by memory lower electrodes 272b and memory supporters (222b and 224b), and memory dielectric films 274b and an upper electrodes 276, which cover the memory lower electrode structures ESb, may be formed. The memory lower electrodes 272b, the memory dielectric films 274b, and the upper electrodes 276 may form the memory capacitors 270b, and the memory capacitors 270b may form single block structures on the first memory cell blocks CA1_1 with the memory supporters (222b and 224b). The memory lower electrode structures ESb and the memory dielectric films 274b may correspond to the capacitor region lower electrode structures ESa and the capacitor region dielectric films 274a, respectively, and the above description of the driving capacitor 270a may be applicable to the memory capacitors 270b.

In the second cell areas CA2_2, dummy lower electrode structures ESc2, which are formed by dummy lower electrodes 272c and second dummy supporters (222c2 and 224c2), and second dummy dielectric films 274c2 and upper electrodes 276, which cover the dummy lower electrode structures ESc2, may be formed. The lower electrodes 272c, the second dummy dielectric films 274c2, and the upper electrodes 276 may form the dummy capacitors 270c, and the dummy capacitors 270c may form single block structures on the second cell areas CA2_2 with the second dummy supporters (222c2 and 224c2). The dummy lower electrode structures ESc2 and the second dummy dielectric films 274c2 may correspond to the capacitor region lower electrode structures ESa and the capacitor region dielectric films 274a, respectively, and the above description of the driving capacitors 270a may be applicable to the dummy capacitors 270c.

The dummy lower electrodes 272c may include first dummy lower electrodes 272c_1 having a first diameter DI1 and second dummy lower electrodes 272c_2 having a second diameter DI2. The first dummy lower electrodes 272c_1 may be disposed adjacent to the die forming area 10, and the second dummy lower electrodes 272c_2 may be disposed adjacent to the first cell areas CA1_2.

The first diameter DI1 may be greater than the second diameter DI2, and the second dummy lower electrodes 272c_2 may not be in contact with the second dummy contacts 104_c2. The uppermost surfaces of the dummy lower electrode structures ESc2 are illustrated as extending in parallel to the substrate 101, but the present disclosure is not limited thereto. Alternatively, the uppermost surfaces of the dummy lower electrode structures ESc2 may be inclined with respect to the substrate 101. Referring still to FIG. 5, a width W1 of the cell areas (CA1_2 and CA2_2) may be 30 μm to 50 μm, and a distance W2 between the cell areas (CA1_2 and CA2_2) may be 2 nm to 5 nm.

In the first cell areas CA1_2, no lower electrodes may be disposed on the lower structure 100. Instead, dummy structures DSc1 may be formed in the first cell areas CA1_2, and in each of the dummy structures DSc1, a first dummy mold film 212c1, a first dummy supporter film 222c1, a second dummy mold film 214c1, and a second dummy supporter film 224c may be sequentially stacked. First dummy dielectric films 274c1 and upper electrodes 276 may be formed on first dummy supporter films 224c1. The first dummy dielectric films 274c1 and the upper electrodes 276 may be formed of the same materials as the capacitor region dielectric films 274a and the upper electrodes 276, respectively.

The capacitor region supporters (222a and 224a), the memory supporters (222b and 224b), the second dummy supporters (222c2 and 224c2), and first dummy supporter films (222c1 and 224c1) may be formed by patterning first and second supporter layers 222 and 224 that will be described later with reference to FIG. 7.

The capacitor region supporters (222a and 224a), the memory supporters (222b and 224b), the second dummy supporters (222c2 and 224c2), and the first dummy supporter films (222c1 and 224c1) may be placed on the same level. Also, the capacitor region supporters (222a and 224a), the memory supporters (222b and 224b), the second dummy supporters (222c2 and 224c2), and the first dummy supporter films (222c1 and 224c1) may be formed of the same material.

First dummy mold films (212c1 and 214c1) may be formed of a material having an etching selectivity with respect to the first dummy supporter films (222c1 and 224c1). For example, in a case where the first dummy supporter films (222c1 and 224c1) are formed of silicon nitride, the first dummy mold films (212c1 and 214c1) may be formed of silicon oxide, but the present disclosure is not limited thereto.

In the peripheral region PR, which is the space between cell areas or memory blocks, an interlayer insulating film 290 may be formed on the lower structure 100. The interlayer insulating film 290 may include, for example, silicon oxide, but the present disclosure is not limited thereto.

FIGS. 7 through 19 are cross-sectional views illustrating intermediate steps of a method of manufacturing a semiconductor device according to some embodiments of the present disclosure. FIGS. 7 through 19 are cross-sectional views taken along lines A-A', B-B', and C-C' of FIG. 2.

Figure 7:
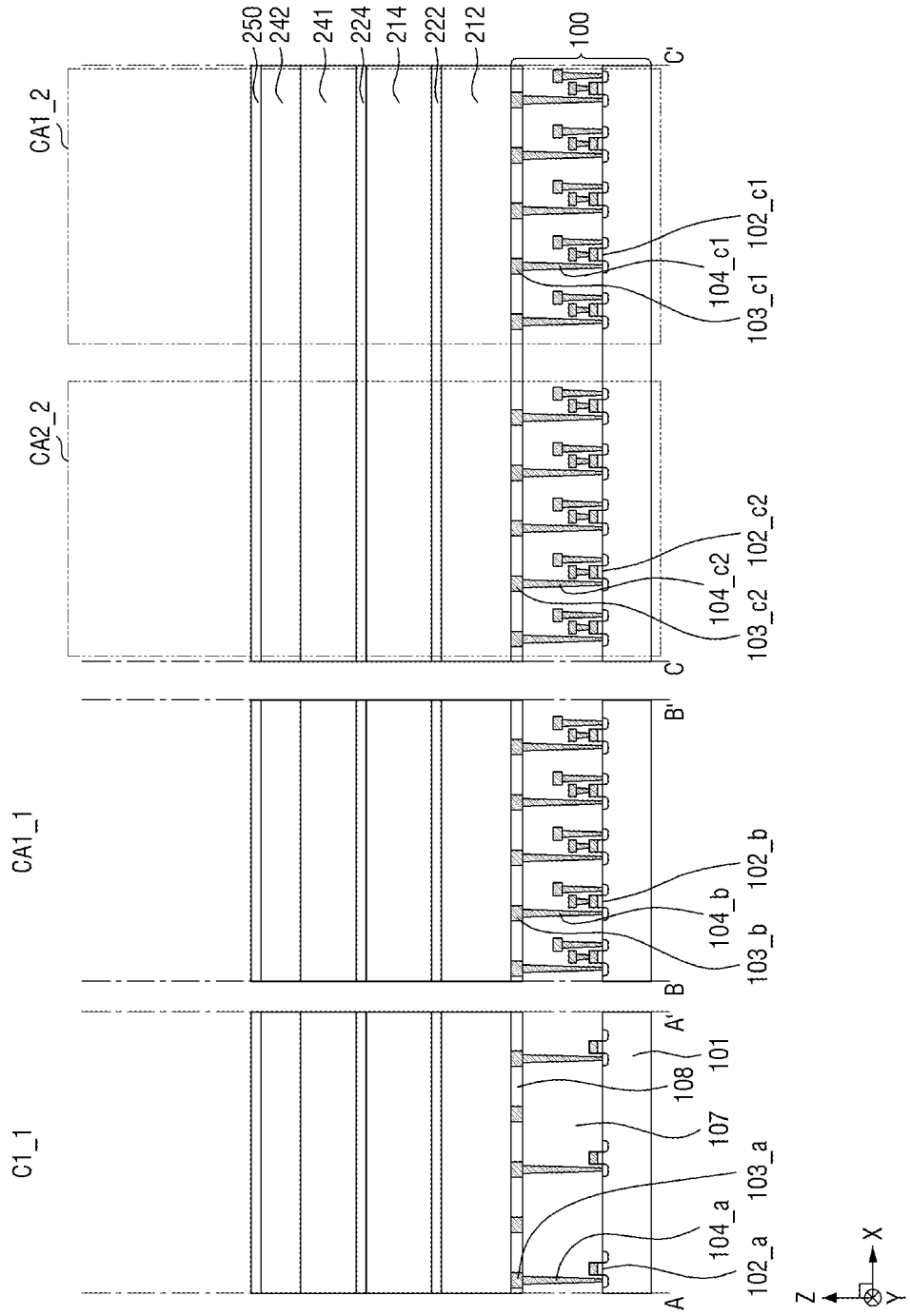
FIGS. 7 through 19 are cross-sectional views illustrating intermediate steps of a method of manufacturing a semiconductor device according to some embodiments of the present disclosure.

Referring to FIG. 7, a first mold layer 212, a first supporter layer 222, a second mold layer 214, a second supporter layer 224, a first mask layer 241, a second mask layer 242, and an antireflection layer 250 may be formed on a lower structure 100 on a wafer-by-wafer basis. The first mold layer 212, the first supporter layer 222, the second mold layer 214, the second supporter layer 224, the first mask layer 241, the second mask layer 242, and the antireflection layer 250 may each be formed by any one of a physical vapor deposition (PVD) process, a chemical vapor deposition (CVD) process, an atomic layer deposition (ALD) process, or a spin coating process, for example. The first and second mold layers 212 and 214 may function as sacrificial films for forming the upper electrodes 276 of FIG. 6. In some embodiments, the first and second mold layers 212 and 214 may include, for example, silicon oxide.

The first and second supporter layers 222 and 224 may be material layers for forming lower electrodes (272a, 272b, and 272c), the memory supporters (222b and 224b), the second dummy supporters (222c2 and 224c2), and the first dummy supporter films (222c1 and 224c1) of FIG. 6. In some embodiments, the first and second supporter layers 222 and 224 may be formed of a material having an etching selectivity with respect to the first and second mold layers 212 and 214. For example, in a case where the first and second mold layers 212 and 214 are formed of silicon oxide, the first and second supporter layers 222 and 224 may be formed of silicon nitride, but the present disclosure is not limited thereto.

Figure 11:
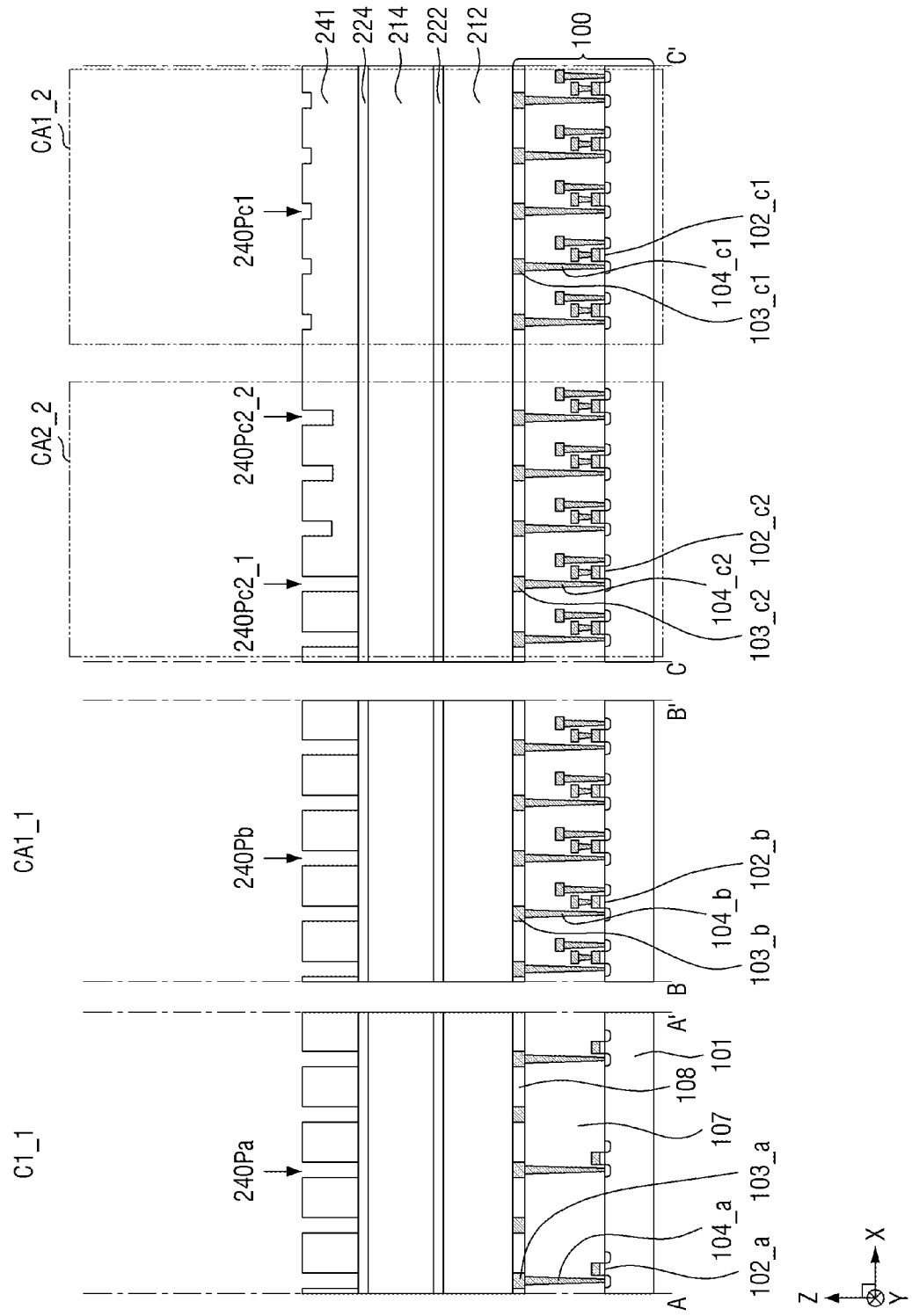

The first and second mask layers 241 and 242 may be material layers for forming first preliminary hole patterns 24Pc1, second preliminary hole patterns 240Pc2, and preliminary hole patterns (240Pa and 240Pb) (in the die forming area 10) of FIG. 11. The first and second mask layers 241 and 242 may be formed of materials having different etching selectivities.

In some embodiments, the first mask layer 241 may include silicon oxide, and the second mask layer 242 may include a spin-on-hardmask (SOH). However, the present disclosure is not limited to this.

The antireflection layer 250 may be formed on the second mask layer 242. The antireflection layer 250 may include silicon nitride or silicon oxynitride. For example, the antireflection layer 250 may include silicon oxynitride. The antireflection layer 250 may be thinner than a preliminary pattern layer 270 that will be described later. The top surfaces of the first and second mask layers 241 and 242 may be located at the same height from the substrate 101, between the die forming area 10 and the edge die area 20. The antireflection layer 250 may prevent diffuse reflection when the preliminary pattern layer 270 is exposed to light and may thus be used in photolithography.

Although not specifically illustrated, a carbon-containing layer may be disposed between the second supporter layer 224 and the first mask layer 241. The carbon-containing layer may be, for example, an amorphous carbon layer (ACL), and may be referred to as a plane when the first mask layer 241, the second mask layer 242, and the antireflection layer 250 are yet to be stacked. That is, no height difference in the carbon-containing layer. Also, by forming patterns on the carbon-containing layer, the carbon-containing layer can be used as an etching mask.

Figure 8:
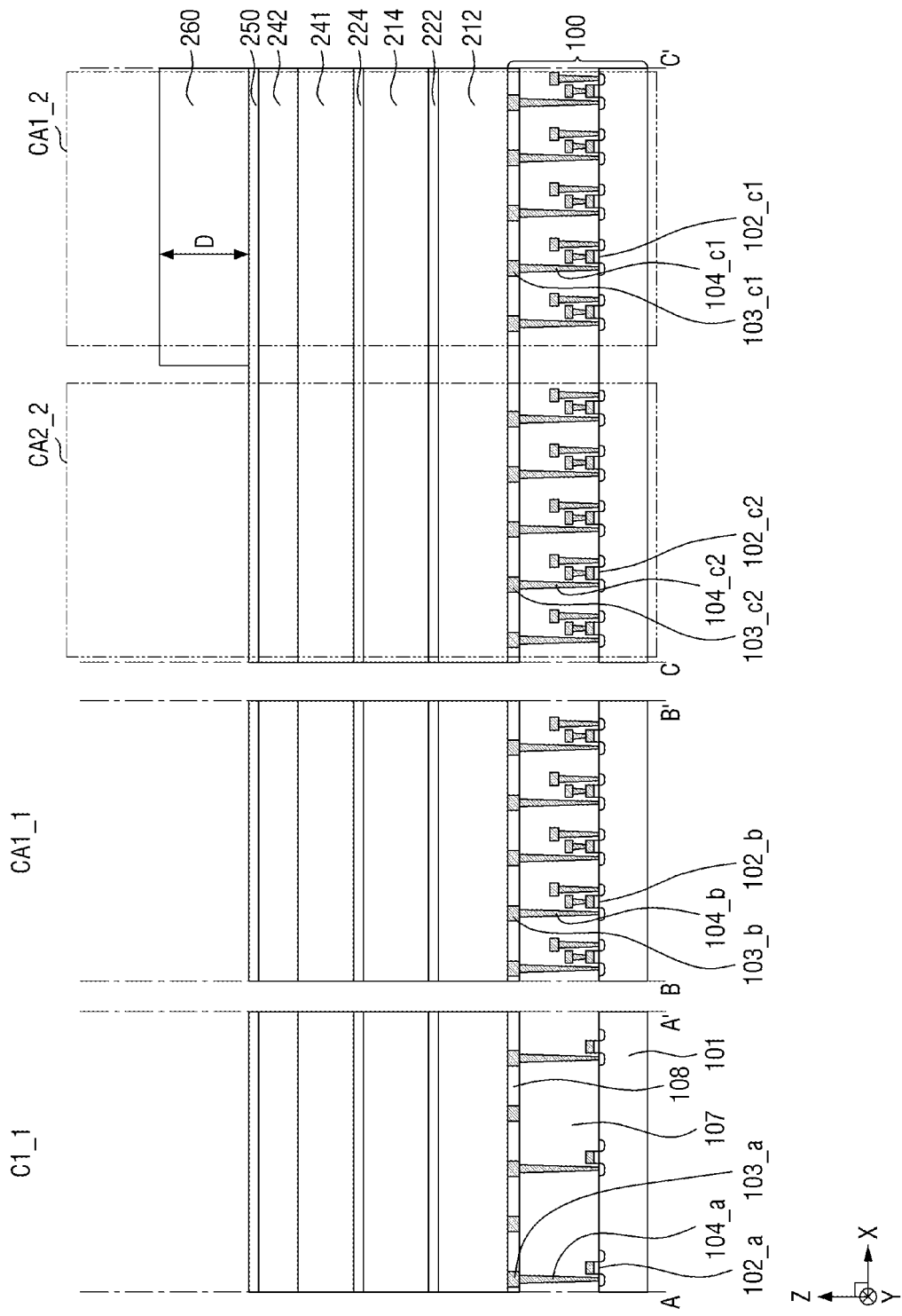

Referring to FIG. 8, an etch stopper film 260 may be selectively formed on the antireflection layer 250 to cover the top surfaces of the first cell areas CA1_2 adjacent a periphery of the wafer 1 and may be not formed on the second cell areas CA2_2 formed between the die forming area 10 and the first cell areas CA1_2 and the die forming area 10. The etch stopper film 260 may include a photosensitive etch stopper (PSES) mask layer and may be formed of a material having an etching selectivity with respect to the preliminary pattern layer 270, the antireflection layer 250, and the second mask layer 242. For example, the etch stopper film 260 may include, for example, at least one of a carbon compound, silicon oxide, silicon nitride, silicon oxynitride, a metal film, photoresist, spin-on-glass (SOG), and SOH. A thickness D of the etch stopper film 260 may be 200 nm to 400 nm, which may be compared with the thickness of the preliminary pattern layer 270.

Figure 9:
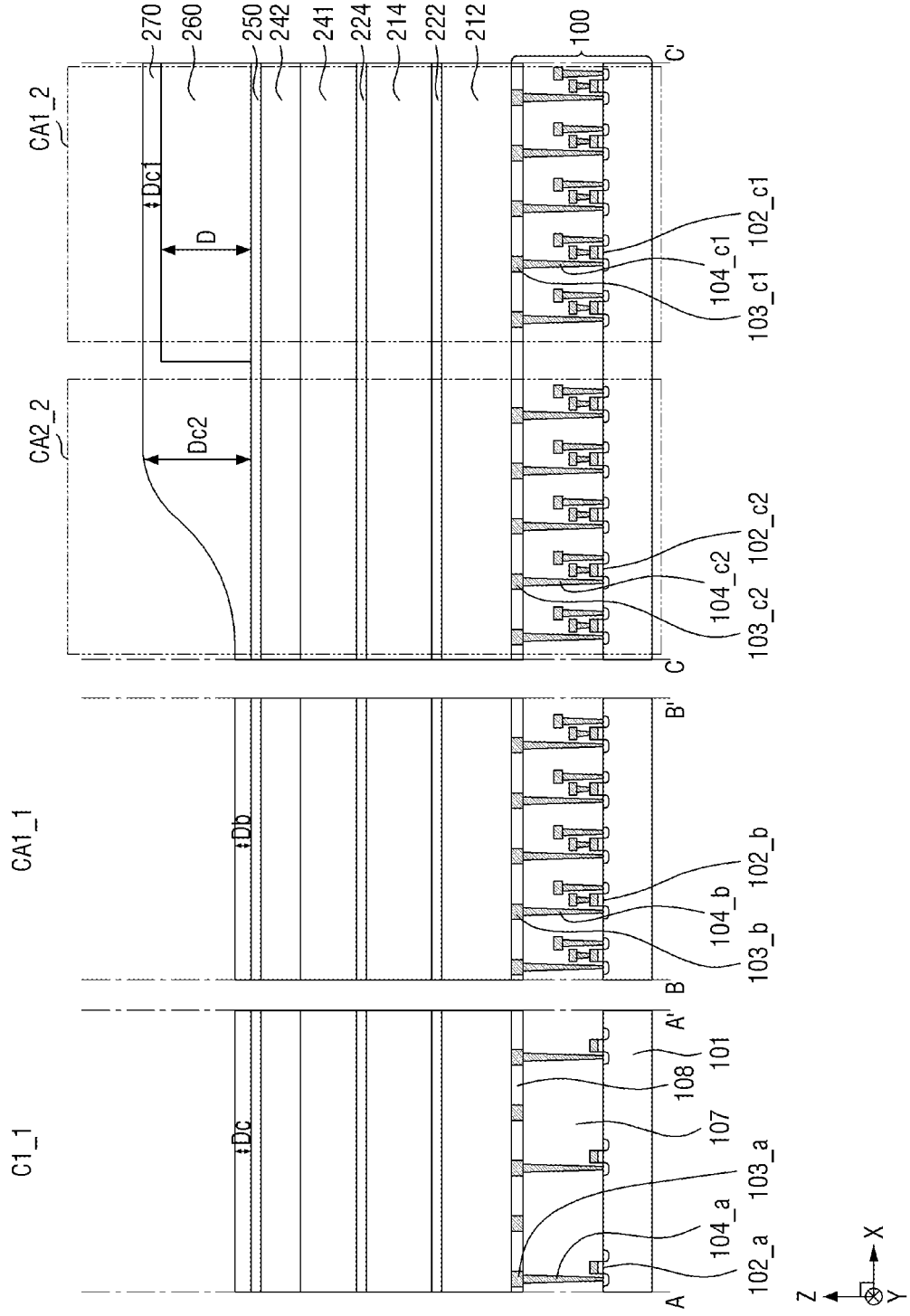

Referring to FIG. 9, the preliminary pattern layer 270 may be formed on the etch stopper film 260 in the first cell areas CA1_2, and may be formed on the antireflection layer 250, in the second cell areas CA2_2 and the die forming area 10. The preliminary pattern layer 270 may be a material layer for forming first patterns Pc1, second patterns Pc2, and patterns (Pa and Pb) (in the die forming area 10) of FIG. 10. The preliminary pattern layer 270 is illustrated as being a single layer but may include a plurality of material layers. The preliminary pattern layer 270 may include photoresist or a carbon compound. Here, the photoresist may be photoresist on which extreme ultraviolet (EUV) patterning is to be performed. EUV light is light having a wavelength of 4 nm to 124 nm, and in the embodiment of FIGS. 7 through 15, EUV light having a wavelength of 4 nm to 20 nm may be used and may be generated by providing laser light to a plasma source material (e.g., TiN). Polymethylmethacrylate (PMMA) or poly(4-hydroxystryrene) may be used as the photoresist, but the present disclosure is not limited thereto.

In order to properly perform EUV patterning without error, thicknesses Da and Db of the preliminary pattern layer 270 in the die forming area 10 may be 50 nm to 80 nm, and a thickness Dc2 of the preliminary pattern layer 270 in the first cell areas CA1_2 may be 50 nm to 80 nm. A thickness D3 of the preliminary pattern layer 270 in the second cell areas CA2_2, which are disposed between the die forming area 10 and the first cell areas CA1_2, may be 50 nm to 500 nm due to the presence of the etch stopper film 260 in the first cell areas CA1_2, and may gradually increase up to 500 nm, closer to the first cell areas CA1_2.

Figure 10:
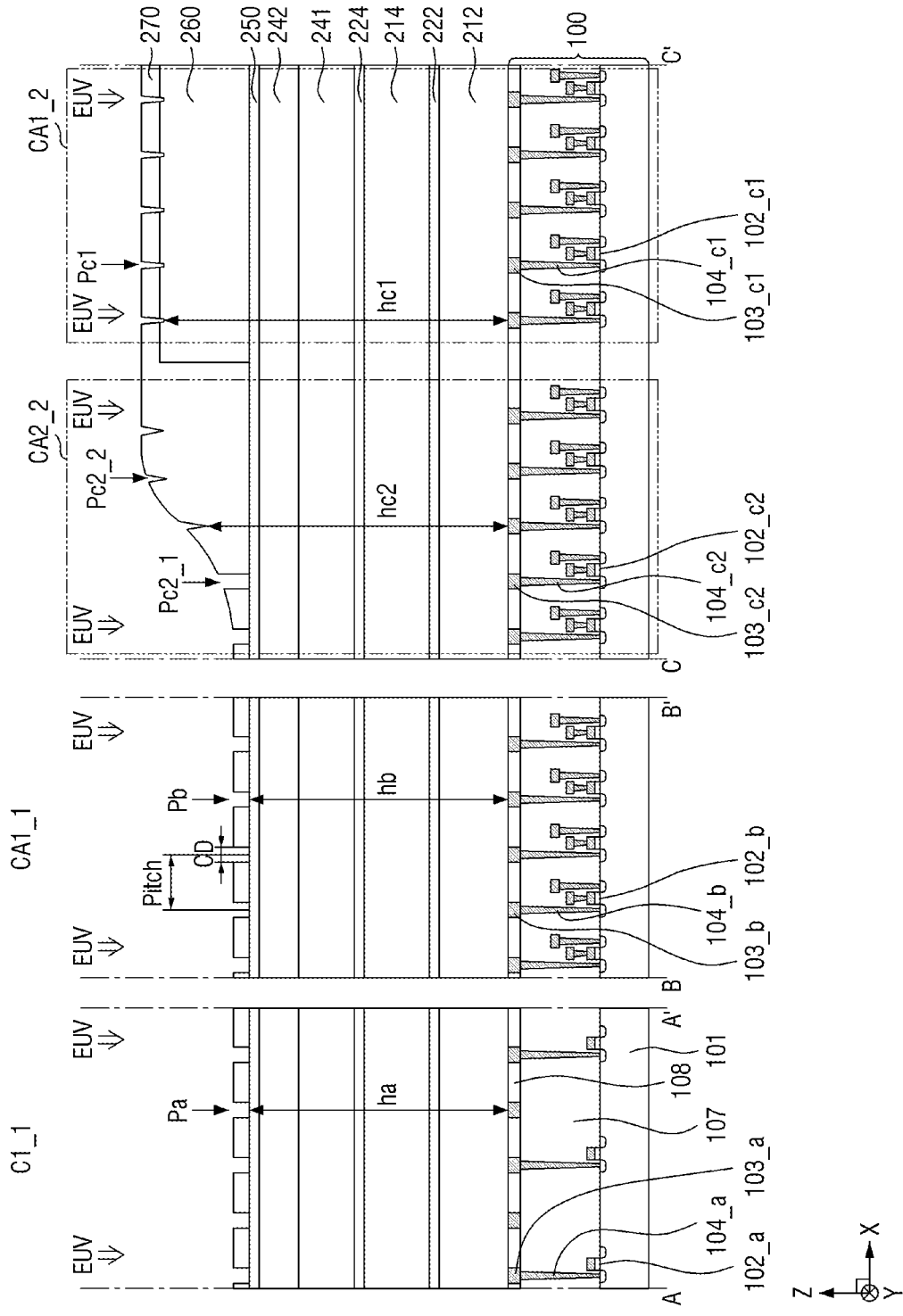

Referring to FIG. 10, the first patterns Pc1 in the first cell areas CA1_2, the second patterns Pc2 in the second cell areas CA2_2, and the patterns (Pa and Pb) in the die forming area 10 may be formed by exposing the preliminary pattern layer 270 to EUV light. In a case where EUV light is applied to the preliminary pattern layer 270, a linewidth CD of the patterns (Pa and Pb) may be 3 nm to 4 nm, and the pitch between the patterns (Pa and Pb) may be 20 nm to 40 nm.

The second patterns Pc2 may include normal patterns Pc2_1, which can guarantee a full linewidth throughout to the bottoms thereof due to the thickness Dc2 of the preliminary pattern layer 270, and defective patterns Pc2_2, which do not guarantee a full linewidth throughout to the bottoms thereof or do not penetrate the preliminary pattern layer 270, and the defective patterns Pc2_2 may be generated near the boundary with the first cell areas CA1_2, as shown. Each of the defective patterns Pc2_2 may have a wedge shape that tapers down to a point toward the bottom thereof.

The first patterns Pc1 may be formed in the first cell areas CA1_2, however, the etch stopper film 260, which may be disposed below the first patterns Pc1, may be partially etched during the formation of the first patterns Pc1. The thicknesses and linewidths of and the pitches between the first patterns Pc1, the second patterns Pc2, and/or the patterns (Pa and Pb) may be controlled by the amount of EUV light applied and the temperature at which EUV patterning is performed.

Alternatively, the first patterns Pc1, the second patterns Pc2, and the patterns (Pa and Pb) may be formed by performing EUV patterning on a single layer (e.g., a self-assembled monolayer) using the difference in the ALD of, for example, ZnO, between an area to which EUV light is applied and an area to which no EUV light is applied. Even in this case, the thicknesses and linewidths of and the pitches between the first patterns Pc1, the second patterns Pc2, and/or the patterns (Pa and Pb) may also be controlled by the amount of EUV light applied and the temperature at which EUV patterning is performed.

Referring to FIG. 11, mask patterns, i.e., preliminary hole patterns (240Pa, 240Pb, 240Pc1, and 240Pc2), may be formed by etching the first and second mask layers 241 and 242 in the first cell areas CA1_2, the second cell areas CA2_2, and the first chip capacitors C1_1 and the first memory cell blocks CA1_1 in the die forming area 10, using, as etching mask patterns, the first patterns Pc1 in the first cell areas CA1_2, the second patterns Pc2 in the second cell areas CA2_2, and the patterns (Pa and Pb) in the die forming area 10.

During the formation of first preliminary hole patterns 240Pc1, second preliminary hole patterns 240Pc2, and preliminary hole patterns (240Pa and 240Pb) in the die forming area 10, the etch stopper film 260, the antireflection layer 250, and the second mask layer 242 may be removed, and due to the presence of the etch stopper film 260 and the defective patterns Pc2_2, the preliminary hole patterns (240Pa and 240Pb) and some of the second preliminary patterns 240Pc2 (i.e., second preliminary patterns 240Pc2_1) may penetrate the first mask layer 241, but the first preliminary hole patterns 240Pc1 and some of the second preliminary patterns 240Pc2 (i.e., second preliminary patterns 240Pc2_2) may not penetrate the first mask layer 241.

Figure 12:
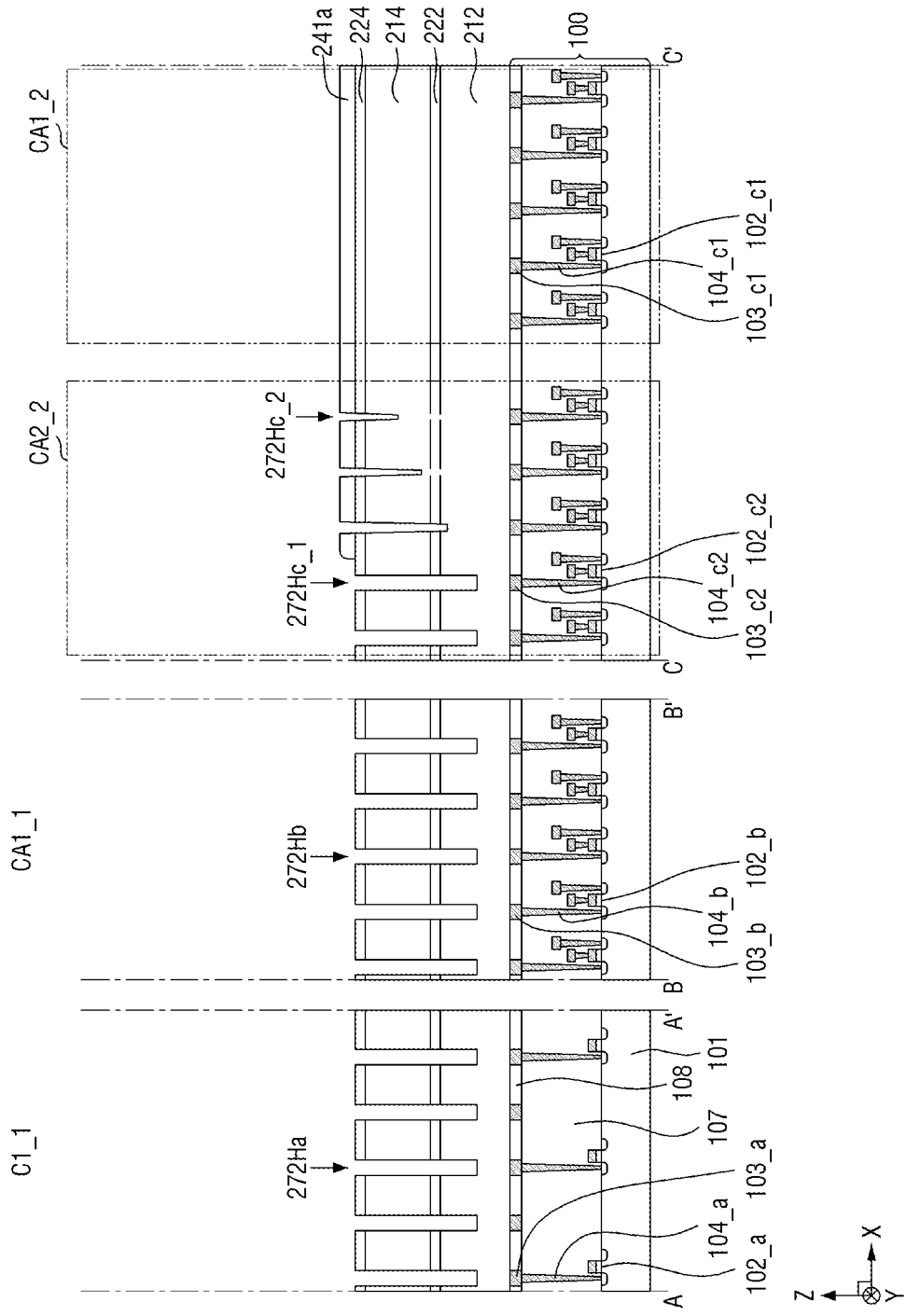
Figure 13:
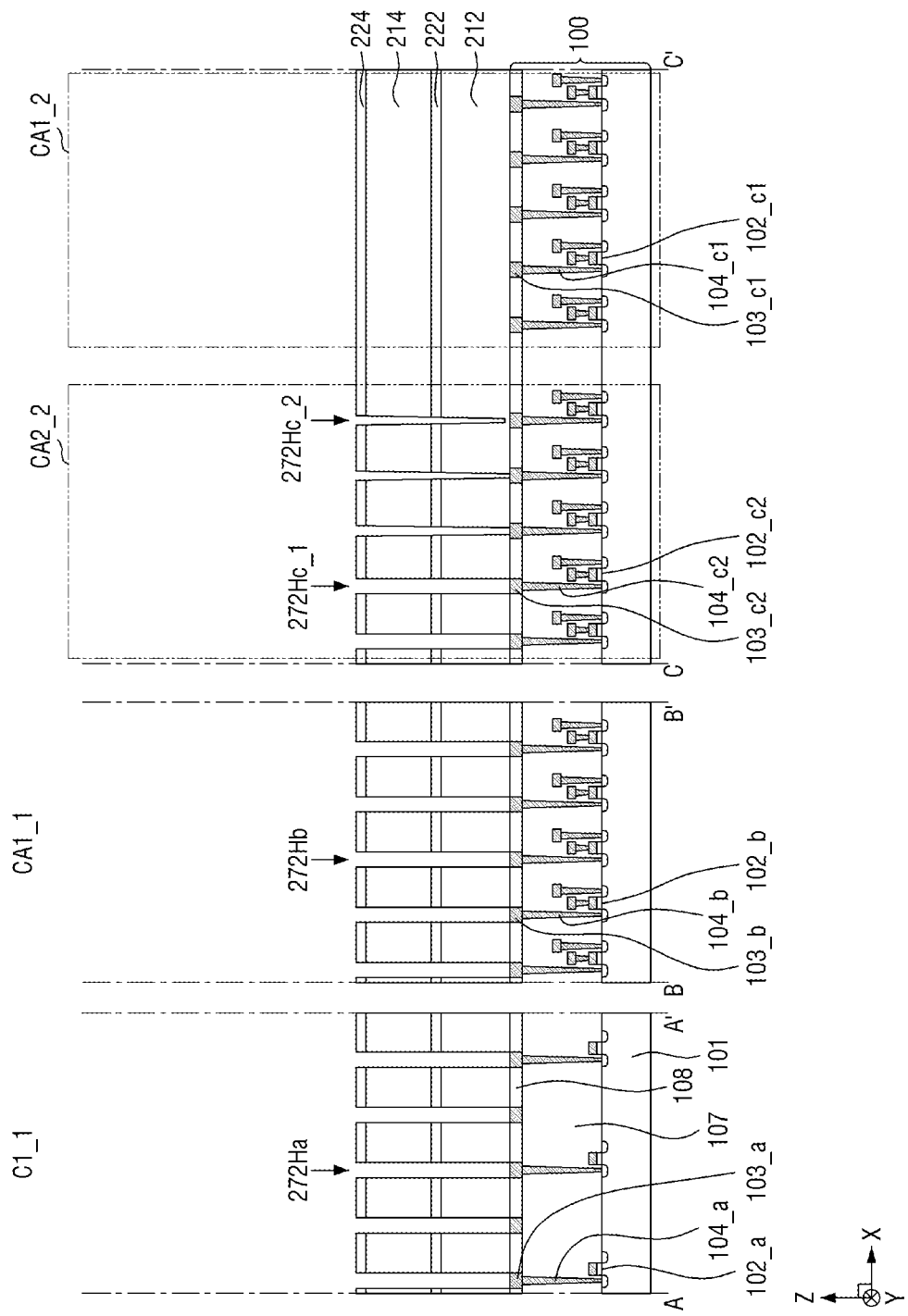

Referring to FIGS. 12 and 13, dummy lower electrode hole patterns 272Hc in the second cell areas CA2_2, memory lower electrode hole patterns 272Hb in the first memory cell blocks CA1_1, and capacitor region lower electrode hole patterns 272Hc in the first chip capacitors C1_1 may be formed by etching the first mold layer 212, the first supporter layer 222, the second mold layer 214, and the second supporter layer 224 in the second cell areas CA2_2 and the die forming area 10 using the first preliminary hole patterns 240Pc1, the second preliminary hole patterns 240Pc2, and the preliminary hole patterns (240Pa and 240Pb) as etching mask patterns.

The capacitor region lower electrode hole patterns 272Ha and the memory lower electrode hole patterns 272Hb may penetrate the first mold layer 212, the first supporter layer 222, the second mold layer 214, and the second supporter layer 224 to expose the driving contacts 104_a and the memory contacts 104_b. Some of the dummy lower electrode hole patterns 272Hc, i.e., first dummy lower electrode hole patterns 272Hc_1, may expose the second dummy contacts 104_c2, but some of the dummy lower electrode hole patterns 272Hc, i.e., second dummy lower electrode hole patterns 272Hc_2, do not completely penetrate the first mold layer 212, the first supporter layer 222, the second mold layer 214, and the second supporter layer 224 and thus do not expose the second dummy contacts 104_c2. Accordingly, because the first preliminary hole patterns 240Pc1 do not penetrate the first mask layer 241, lower electrode hole patterns (272Ha, 272Hb, and 272Hc) are not formed in the first cell areas CA1_2.

During the formation of the lower electrode hole patterns (272Ha, 272Hb, and 272Hc), the first mask layer 241 may be partially removed, and height differences may be generated due to: (i) the height difference as illustrated in FIG. 9, and (ii) the differences in etching selectivity between the first mask layer 241, the first mold layer 212, the first supporter layer 222, the second mold layer 214, and the second supporter layer 224.

Figure 14:
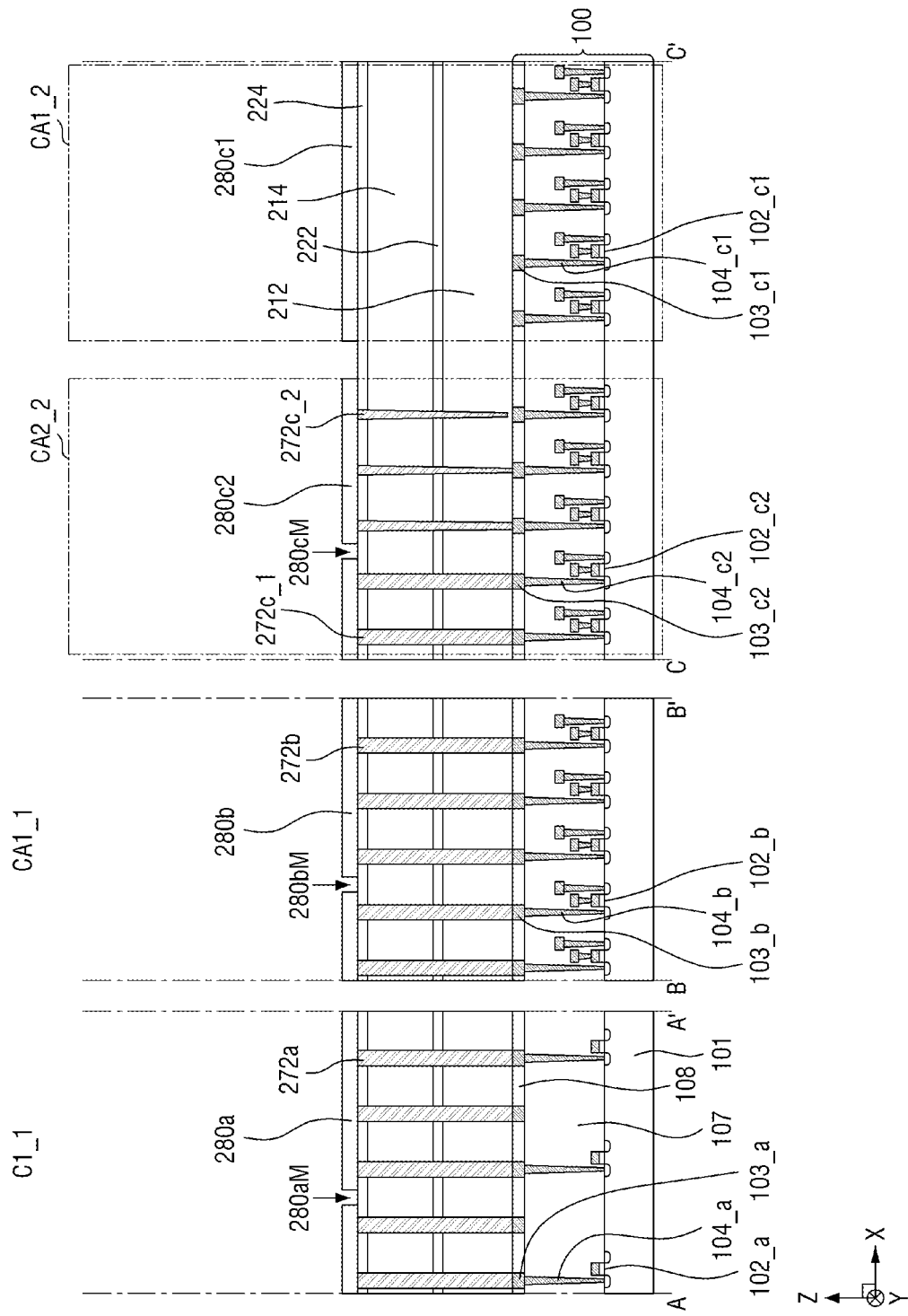

Referring to FIG. 14, the capacitor region lower electrodes 272a, the memory lower electrodes 272b, and the dummy lower electrodes 272c may be formed in the capacitor region lower electrode hole patterns 272Ha, the memory lower electrode hole patterns 272Hb, and the dummy lower electrode hole patterns 272Hc, respectively. In addition, a supporter mask layer 280 including supporter mask patterns (280aM, 280bM, and 280cM) may be formed on the second supporter layer 224 and the lower electrodes (272a, 272b, and 272c). The supporter mask layer 280 may include silicon oxide or SOH, but the present disclosure is not limited thereto. The supporter mask patterns (280aM, 280bM, and 280cM) may be disposed in the first capacitors C1_1, the first memory cell blocks CA1_1, and the second cell areas CA2_2 where the lower electrode hole patterns (272Ha, 272Hb, and 272Hc) are formed.

The supporter mask patterns (280aM, 280bM, and 280cM) may be formed by EUV, ArF, KrF, or electron beams as parallel lines, parallel bars, rectangles, or circles in a plan view, but the present disclosure is not limited thereto. The supporter mask patterns (280aM, 280bM, and 280cM) and the lower electrodes (272a, 272b, and 272c) are illustrated as not overlapping in a plan view. Alternatively, the supporter mask patterns (280aM, 280bM, and 280cM) and the lower electrodes (272a, 272b, and 272c) may partially overlap.

Figure 15:
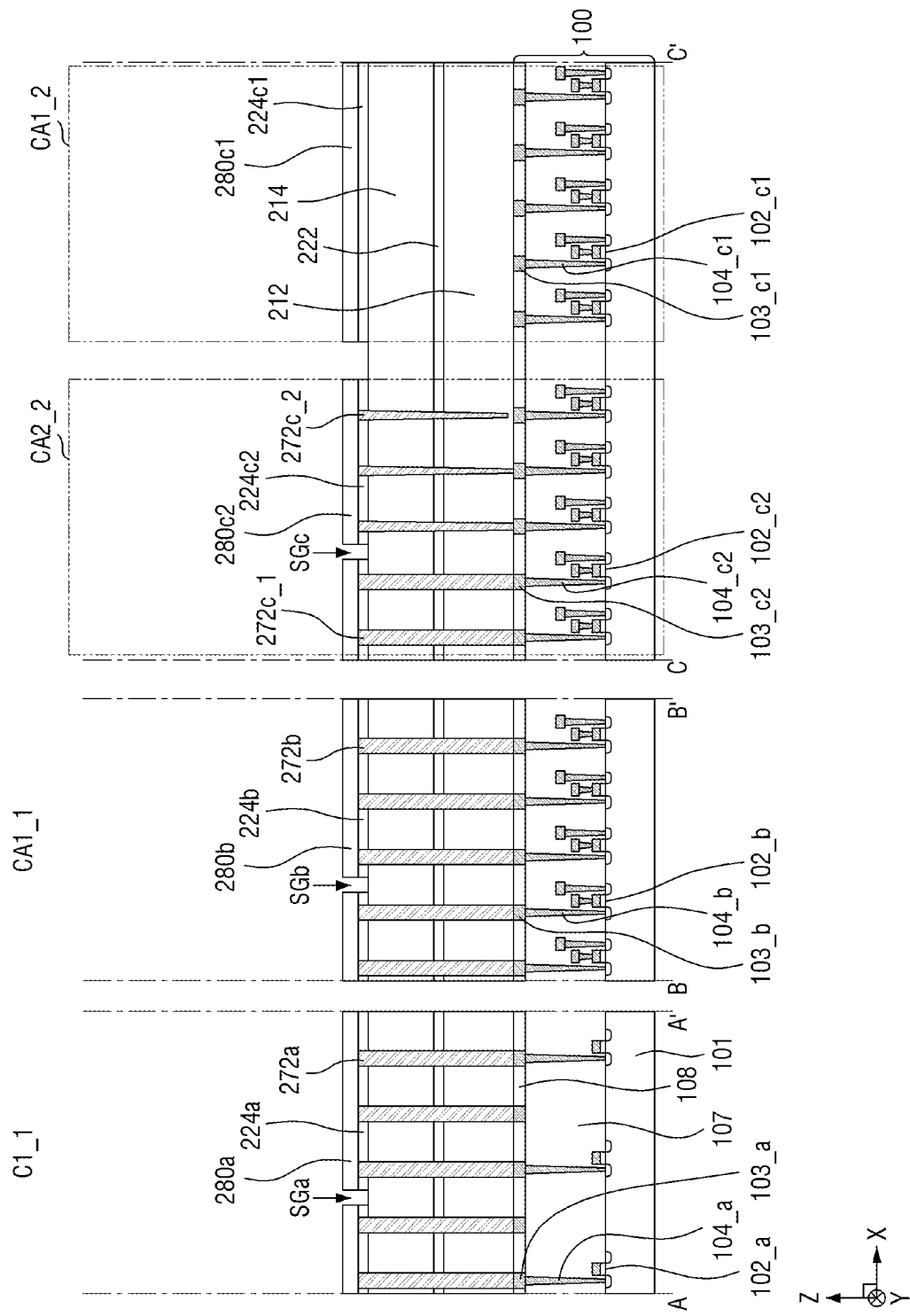
Figure 16:
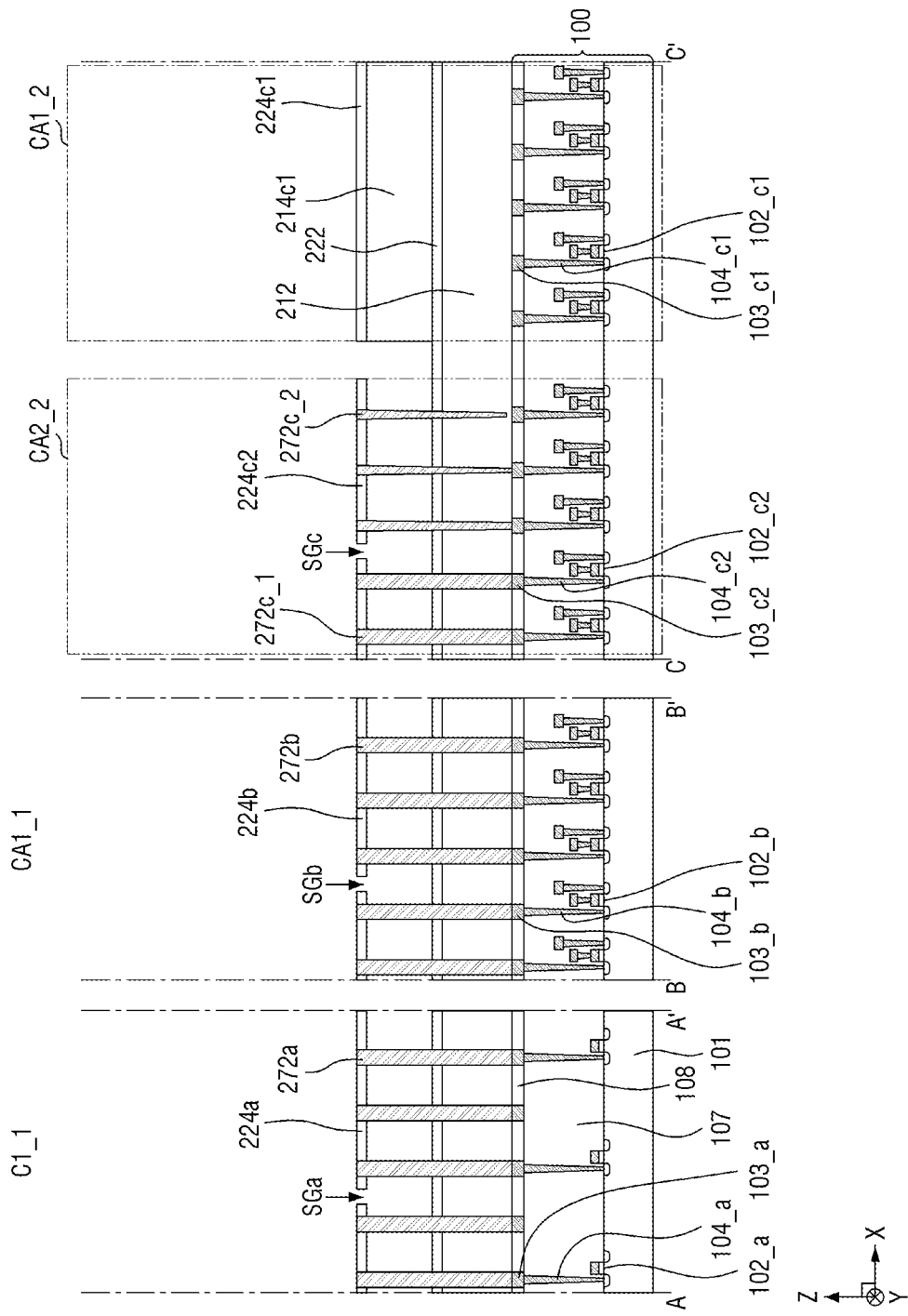
Figure 17:
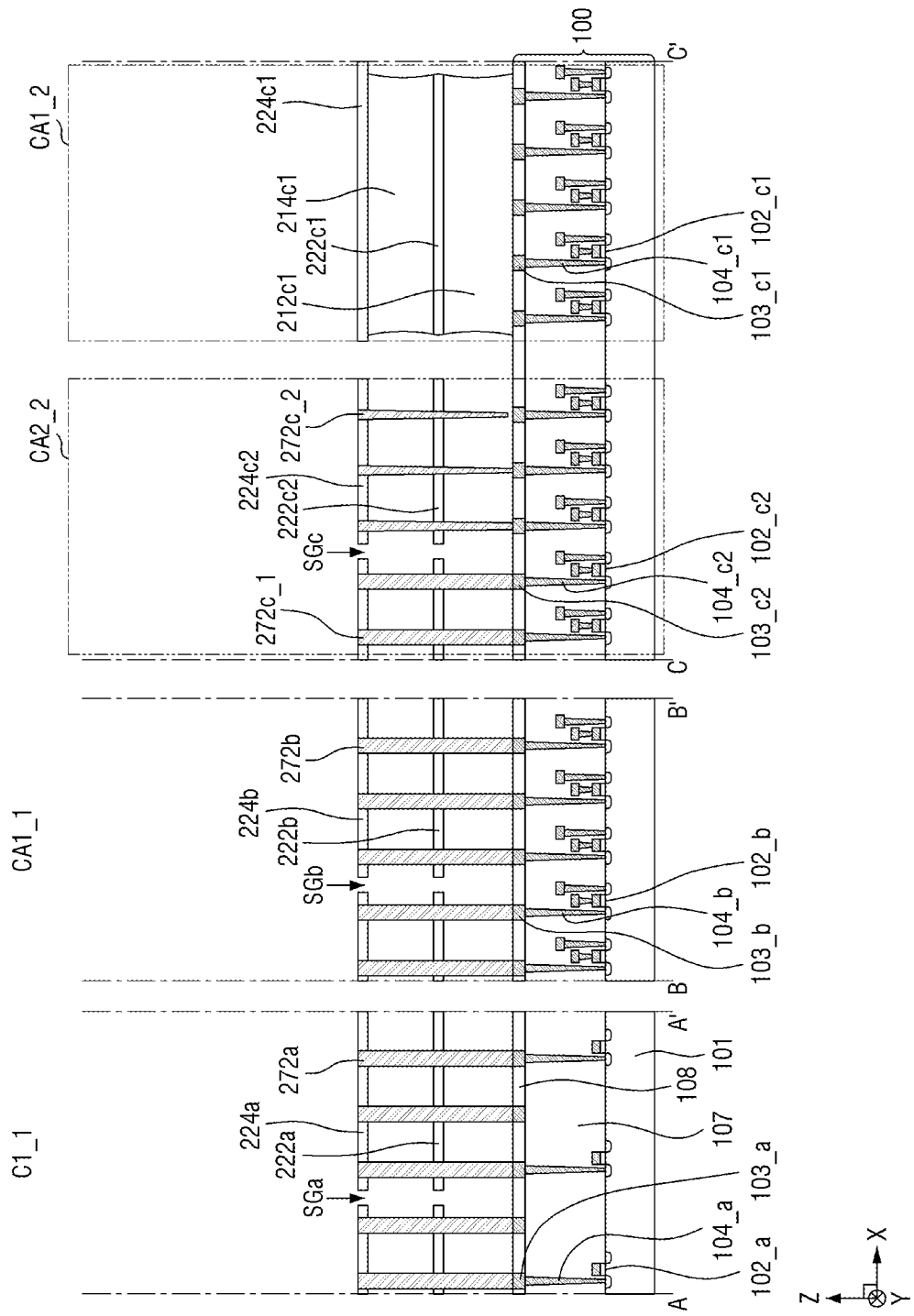

Referring to FIGS. 15 through 17, parts of the second supporter layer 224 below the supporter mask patterns (280aM, 280bM, and 280cM) may be removed using the supporter mask layer 280 as an etching mask, thereby forming supporter openings (SGa, SGb, and SGc) along the sidewalls of each of the capacitor region supporters (222a and 224a), the sidewalls of each of the memory supporters (222b and 224b), and the sidewalls of each of the second dummy supporters (222c2 and 224c2) together with the supporter mask patterns (280aM, 280bM, and 280cM).

During the formation of the supporter openings (SGa, SGb, and SGc), the first and second mold layers 212 and 214 may be removed in the first capacitors C1_1, the first memory cell blocks CA1_1, and the second cell areas CA2_2, thereby exposing the capacitor region lower electrodes 272a, the memory lower electrodes 272b, and the dummy lower electrodes 272c.

The removal of the first and second mold layers 212 and 214 in the first capacitors C1_1, the first memory cell blocks CA1_1, and the second cell areas CA2_2 may be performed by a liftoff process using limulus amoebocyte lysate (LAL), a wet etching process, or ashing and stripping processes.

During the removal of the first and second mold layers 212 and 214 in the first capacitors C1_1, the first memory cell blocks CA1_1, and the second cell areas CA2_2, parts of the first and second mold layers 212 and 214 in the first cell areas CA1_2 may not be removed because of being covered by the first supporter films (222c1 and 224c1), which are disposed in the first cell areas CA1_2. Alternatively, as illustrated in FIG. 17, the sidewalls of each of the first dummy mold films (212c1 and 214c1), which are disposed in the first cell areas CA1_2, may be partially removed and may thus become recessed. In this manner, the capacitor region lower electrode structures ESa, the memory lower electrode structures ESb, the dummy lower electrode structures ESc2, and the dummy structures DSc1 of FIG. 6 may be formed.

Figure 18:
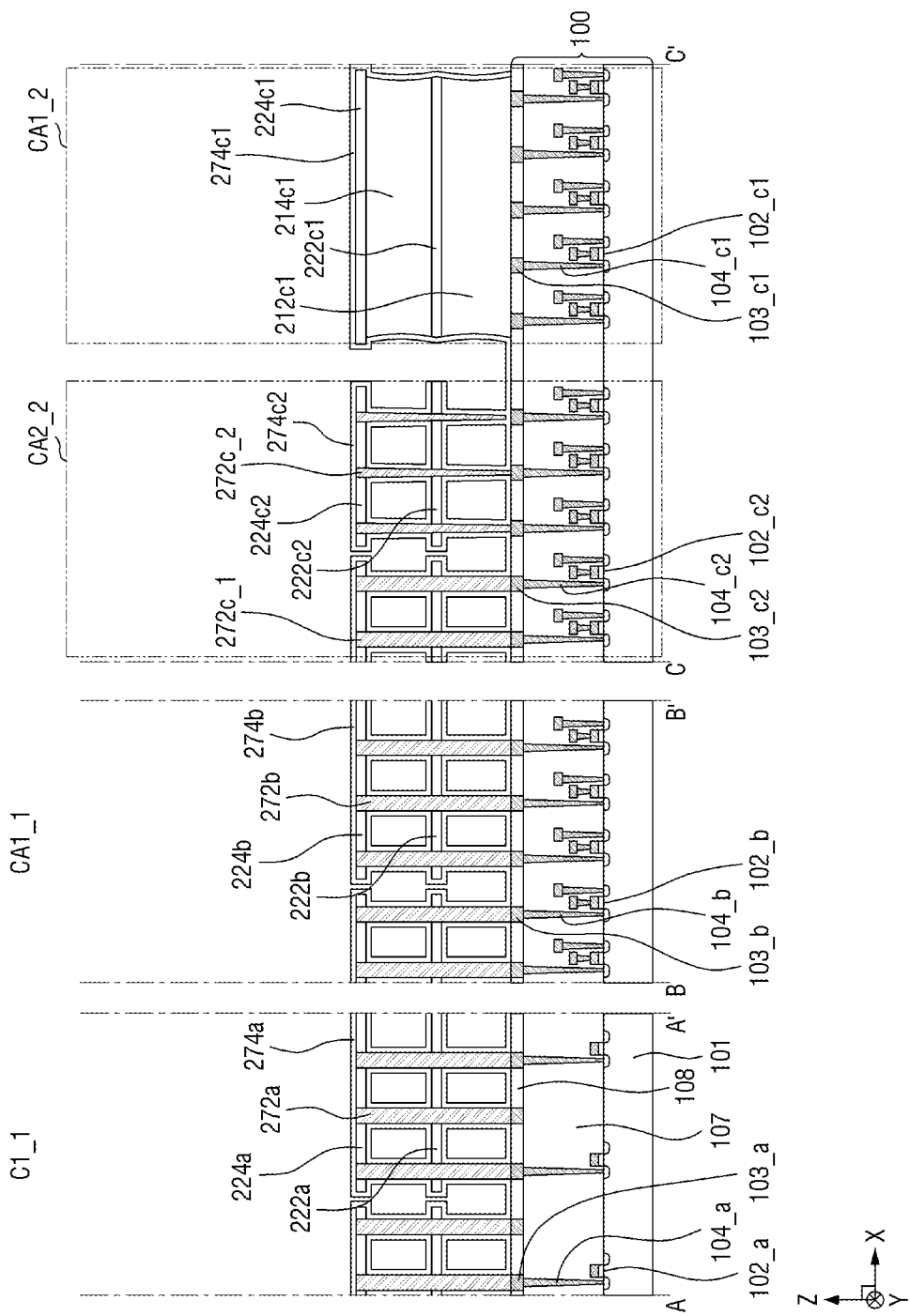
Figure 19:
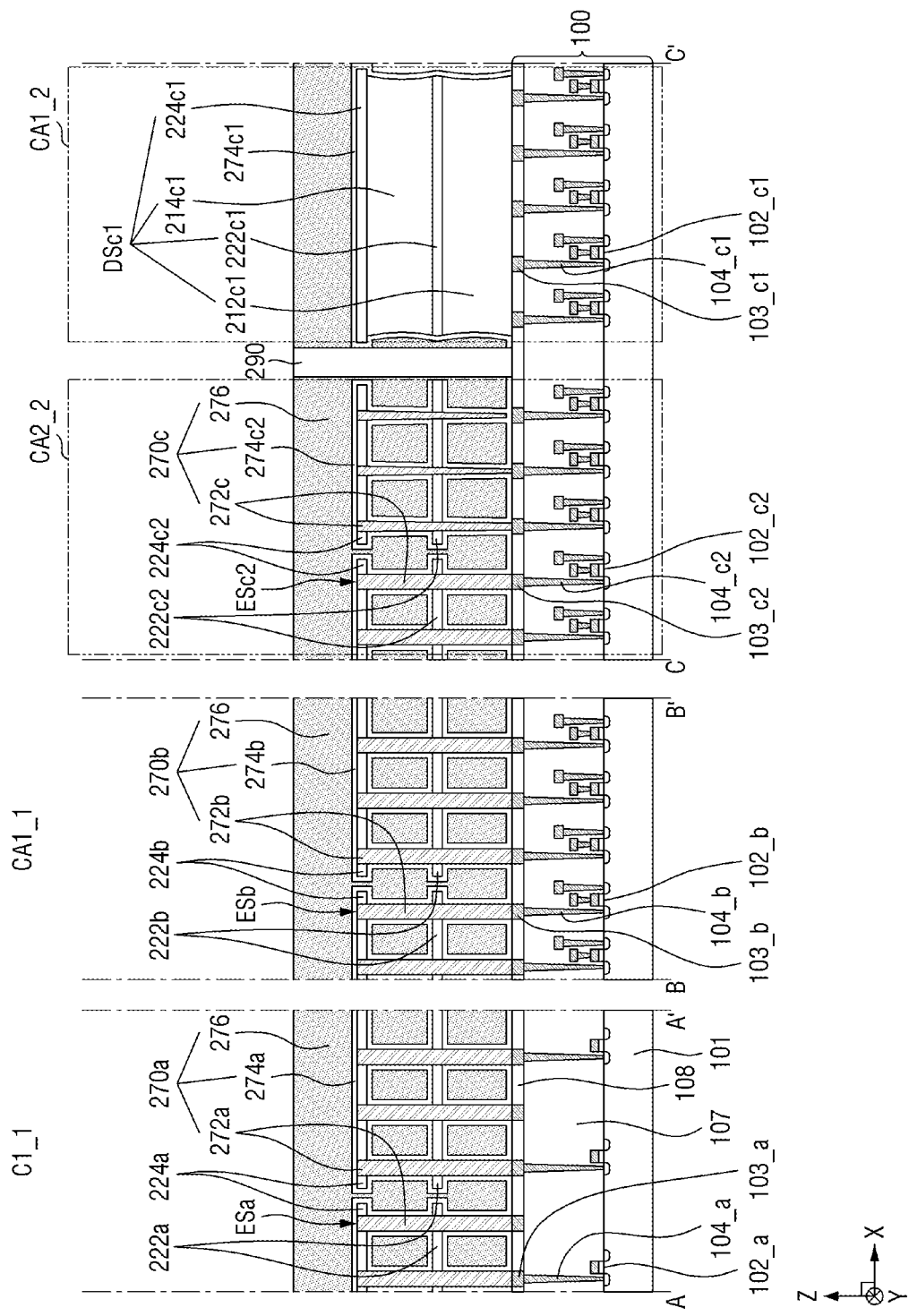

Referring to FIGS. 18 and 19, the capacitor region dielectric films 274a, the memory dielectric films 274b, the second dummy dielectric films 274c2, and the first dummy dielectric films 274c1, which cover the capacitor region lower electrode structures ESa, the memory lower electrode structures ESb, the dummy lower electrode structures ESc2, and the dummy structures DSc1, respectively, may be formed. Thereafter, the upper electrodes 276 may be formed. Upper electrodes 276 disposed between the first cell areas CA1_2 and the second cell areas CA2_2 may be replaced later with interlayer insulating films 290.

In the second cell areas CA2_2 near the first cell areas CA1_2, the defective patterns Pc2_2 may be generated during the exposure of photoresist due to a height difference formed by the etch stopper film 260, and as a result, second dummy lower electrodes 272c_2 having a relatively small diameter or collapsed second dummy lower electrodes 272c_2 may be generated. As the second cell areas CA2_2 are provided in the dummy cell areas (DMY_1 and DMY_2) in the edge die area 20, the reliability of processes performed in the die forming area 10 including the chip 10_1 can be improved. Also, as the etch stopper film 260 is spaced apart by as much as the dummy cell areas (DMY_1 and DMY_Y), there is no need to form height differences in the first and second mask layers 241 and 242 between the die forming area 10 and the edge die area 20, the manufacture of a semiconductor device can be simplified, and as a result, the efficiency of the manufacture of a semiconductor device can be improved.

However, the effects of the embodiments are not restricted to the one set forth herein. The above and other effects of the embodiments will become more apparent to one of daily skill in the art to which the present disclosure pertains by referencing the claims.

What is claimed is:

1. A method of manufacturing a semiconductor device, comprising:
   providing a substrate having, defined thereon, a die forming area and an edge die area, which includes a first cell area and a second cell area disposed between the first cell area and the die forming area;
   sequentially forming a mold layer, a supporter layer, and a mask layer on the substrate;
   forming an etch stopper film to cover a top surface of the first cell area, but not forming the etch stopper film on the second cell area;
   forming a preliminary pattern layer on the etch stopper film and the mask layer;
   forming first patterns, second patterns, and third patterns on the first cell area, the second cell area, and the die forming area, respectively, by exposing the preliminary pattern layer to extreme ultraviolet (EUV) light; and forming hole patterns in the mold layer and the supporter layer in the die forming area and the second cell area by etching the mask layer using the etch stopper film, the second patterns, and the third patterns.

2. The method of claim 1, wherein bottom surfaces of the first patterns, the second patterns, and the third patterns are sequentially higher than the substrate.

3. The method of claim 1, wherein a top surface of the mask layer is disposed at the same height from the substrate, between the die forming area and the edge die area.

4. The method of claim 1, wherein the etch stopper film is not formed on the die forming area.

5. The method of claim 4, wherein
the edge die area further includes a third cell area, which is different from the first and second cell areas,
the method further comprises forming the etch stopper film to cover a top surface of the third cell area, and
no cell area is formed between the third cell area and the die forming area.

6. The method of claim 1, wherein a width of the first and second cell areas is in a range of 30 μm to 50 μm.

7. The method of claim 1, wherein a distance between the first and second cell areas is in a range of 2 nm to 5 nm.

8. The method of claim 1, wherein the forming the hole patterns, comprises forming mask patterns on the mask layer using the etch stopper film, the second patterns, and the third patterns, and etching the mold layer and the supporter layer using the mask patterns.

9. The method of claim 8, wherein
the mask patterns include first preliminary patterns, which are formed in the first cell area, and second preliminary hole patterns, which are formed in the second cell area,
the first preliminary hole patterns do not penetrate the mask patterns, and
at least some of the second preliminary hole patterns penetrate the mask patterns.

10. The method of claim 1, wherein the first patterns, the second patterns, and the third patterns are formed at the same time.

11. The method of claim 1, wherein at least some of the second patterns in the second cell area have a wedge shape that tapers down to a point toward the bottom thereof.

12. The method of claim 11, further comprising:
forming hole patterns in the mold layer and the supporter layer in the die forming area and the second cell area by etching the mask layer using the etch stopper film, the second patterns, and the third patterns.

13. The method of claim 12, further comprising:
forming lower electrodes, which include conductors that extend vertically with respect to the hole patterns.

14. A method of manufacturing a semiconductor device, comprising:
providing a substrate having, defined thereon, a die forming area and an edge die area, which includes a first cell area and a second cell area disposed between the first cell area and the die forming area;
sequentially forming a mold layer, a supporter layer, and a mask layer on the substrate;
forming an etch stopper film to cover a top surface of the first cell area, but not forming the etch stopper film on the second cell area;
forming a preliminary pattern layer on the etch stopper film and the mask layer; and
forming first patterns, second patterns, and third patterns on the first cell area, the second cell area, and the die forming area, respectively, by exposing the preliminary pattern layer to light,
wherein
a top surface of the mask layer is disposed at the same height from the substrate, between the die forming area and the edge die area,
bottom surfaces of the first patterns, the second patterns, and the third patterns are sequentially higher than the substrate, and
at least some of the second patterns in the second cell area have a wedge shape that tapers down to a point toward the bottom thereof.

15. The method of claim 14, wherein the first patterns, the second patterns, and the third patterns are formed at the same time.

16. The method of claim 14, wherein the forming the first patterns, the second patterns, and the third patterns, comprises forming the first patterns, the second patterns, and the third patterns by exposing the preliminary pattern layer to extreme ultraviolet (EUV) light.

17. A method of manufacturing a semiconductor device, comprising:
providing a substrate having, defined thereon, a die forming area, an first edge die area which includes a first cell area and an second edge die area which includes a second cell area different from the first cell area;
sequentially forming a mold layer, a supporter layer, and a mask layer on the substrate;
forming an etch stopper film to cover top surfaces of the first and second cell areas, but not forming the etch stopper film on a dummy cell area between the first cell area and the die forming area and between the second cell area and the die forming area;
forming a preliminary pattern layer on the etch stopper film and the mask layer; and
forming first patterns, second patterns, and third patterns on the first and second cell areas, on the dummy cell area, and on the die forming area, respectively, by exposing the preliminary pattern layer to light,
wherein
at least some of the second patterns in the dummy cell area have a wedge shape that tapers down to a point toward the bottom thereof, and
a first width of the dummy cell area between the first cell area and the die forming area is different from a second width of the dummy cell area between the second cell area and the die forming area.

18. The method of claim 17, wherein
the dummy cell area includes a plurality of separate dummy cell regions,
the plurality of dummy cell regions include a plurality of first dummy cell regions, which are separate and disposed between the first cell area and the die forming area, and a plurality of second dummy cell regions, which are separate and disposed between the second cell area and the die forming area, and
the number of first dummy cell regions is different from the number of second dummy cell regions.

19. The method of claim 17, wherein the forming the first patterns, the second patterns, and the third patterns, comprises forming the first patterns, the second patterns, and the third patterns by exposing the preliminary pattern layer to extreme ultraviolet (EUV) light.

20. The method of claim 17, wherein bottom surfaces of the first patterns, the second patterns, and the third patterns are sequentially higher than the substrate.

* * * * *